United States Patent [19]

Ishii

[11] Patent Number: 6,032,106
[45] Date of Patent: *Feb. 29, 2000

[54] APPARATUS AND METHOD FOR SELECTING PARAMETERS CORRESPONDING TO PHYSICAL CHARACTERISTICS

[76] Inventor: Masaharu Ishii, #406, 2-701 Moritakahigashi, Moriyama-ku, Nagoya-shi, Aichi 463, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/925,619

[22] Filed: Sep. 9, 1997

Related U.S. Application Data

[63] Continuation of application No. 08/350,461, Dec. 7, 1994, abandoned.

[30] Foreign Application Priority Data

Dec. 14, 1993 [JP] Japan ................................. 5-342598
Sep. 7, 1994 [JP] Japan ................................. 6-239394

[51] Int. Cl.[7] ................................................. G06F 15/00
[52] U.S. Cl. ........................... 702/85; 364/158; 364/488
[58] Field of Search .............................. 702/85; 364/158, 364/488, 468.03, 149, 150, 151, 153, 159, 178

[56] References Cited

U.S. PATENT DOCUMENTS 4,771,474  9/1988  Takashima et al. .
4,882,526  11/1989  Iino et al. ............................. 364/150
5,172,312  12/1992  Iino et al. ............................. 364/149

FOREIGN PATENT DOCUMENTS 3035565  5/1982  Germany .

OTHER PUBLICATIONS

"Approximation of Calibration Curves by Rational–Fractional Functions in the Presence of Inexact Data", by Nikulina et al., in *Measurement Techniques*, vol. 31, No. 8, pp. 738–740, Aug., 1988.

*Discrete–Time Signal Processing*, by Oppenheim et al., pp. 462–490 1989.

A Japanese language article by Akira Sano, entitled Identification of Systems With Uncertainty III, published at pp.735–740 of *Measurement and Control*, vol. 32, No. 9, Sep. 1993.

An article by Robert L. Kosut et al., entitled "Set–Membership Identification of Systems With Parametric and Nonparametric Uncertainty", published at pp. 929–941 of *IEEE Transactions On Automatic Control*, vol. 37, No. 7. Jul. 1 1992.

An article by Bo Wahlberg et al., entitled "Hard Frequency–Domain Model Error Bounds From Least–Squares Like Identification Techniques", published at pp. 900–912 of *IEEE Transactions on Automatic Control*, vol. 37, No. 7, Jul. 1992.

(List continued on next page.)

*Primary Examiner*—Louis M. Arana
*Assistant Examiner*—Hien Vo
*Attorney, Agent, or Firm*—Greenblum & Bernstein, P.L.C.

[57] ABSTRACT

A suiting region (lying between an upper bound function $M^+(x)$ and a lower bound function $M^-(x)$) is set by an input having a certain spread, such as error. Inequalities are established between this suiting region and a suiting function containing undetermined parameters. These inequalities are approximated to a finite number of inequalities for the parameters and are solved, whereby a solution region is found. One internal point of this solution region is selected, whereby one suiting function $f(x)$ contained in the suiting region is obtained.

21 Claims, 11 Drawing Sheets

OTHER PUBLICATIONS

Kenneth Steiglitz et al., published at pp. 1901–1909 of IEEE Transactions On Signal Processing, Aug., 1992 (vol. 40, No. 8) entitled "Meteor: A Constraint–Based FIR Filter Design Program".

"Ein Näherungsverfahren zur Bestimmung der konvexen Hülle und verwandte Probleme der algorithmischen Geometrie" by N. Petkov, appeared at pp. 76–79 of *Bild und Ton* 43 (1990) 3.

Kelley, "An Application of Linear Programming to Curve Fitting", *J. Soc. Indust. Appl. Math.*, vol. 6, No. 1, pp. 15–22 (Mar., 1958).

Matthews, et al., "Approximating Transfer Functions by Linear Programming", *Proc., 1st Ann. Allerton Conf. Circuit and Systems Theory,* pp. 191–204 (1963).

Rabiner et al., "Linear Programming Design Of IIR Digital Filters with Arbitrary Magnitude Function", *IEEE Transactions on Acoustics, Speech and Signal Processing,* vol. ASSP–22, No. 2, pp. 117–123 (Apr. 1974).

Steiglitz, "Design of FIR Digital Phase Networks", *IEEE Transactions on Acoustics, Speech and Signal Processing,* vol. ASSP 29, No. 2, pp. 171–176 (Apr. 1981).

ation Ser. No. 08/350,461,
APPARATUS AND METHOD FOR SELECTING PARAMETERS CORRESPONDING TO PHYSICAL CHARACTERISTICS This is a continuation of application Ser. No. 08/350,461, filed Dec. 7, 1994, now abandoned.

BACKGROUND OF THE INVENTION

1. Field of the Invention

The present invention relates to a process arid apparatus which can be utilized for the design of for example a digital filter and which give a suiting function that may be used for such a design.

2. Description of the Related Art

For example, in the design of a conventional digital filter, the practice has been to approximate a curve expressing the amplitude characteristic of the filter by the optimization method and to calculate a transfer function based on that approximated curve. As one example of the optimization method, there has been known a method in which a sequence of points expressing an ideal characteristic is prepared, a function including a plurality of parameters for approximating this is set up, a distance between this function and the sequence of points is sought, and the parameters are determined to give the minimum sum of the square of this distance, whereby a desired approximated curve is obtained.

However, this conventional technique expresses the input data as a set sequence of points with no margin of error and merely calculates the distance between this input data and a target function. Where the input data has a certain degree of spread due to error etc., it has not been able to handle that spread.

SUMMARY OF THE INVENTION

Accordingly, an object of the present invention is to provide a suiting apparatus and a suiting process with which input data having a certain spread etc. can be handled, which was difficult in the past, for dealing with various problems in industry such as for example the construction of a physical system, shape, system identification, graphic display, data interpolation, signal prediction models, pattern recognition, etc.

The suiting apparatus according to the present invention is characterized in that provision is made for at least means for setting a suiting region corresponding to an allowable range of a physical characteristic and a suiting function determination means for finding a suiting function at least approximately contained in the range of this suiting region by solving simultaneous inequalities, wherein the suiting function determination means sets the suiting function as a family with certain parameters and, at the same time, finds the range of each parameter value by solving the simultaneous inequalities.

Also, the suiting process according to the present invention is characterized in that it provides at least a first step of setting a suiting region corresponding to the allowable region of a physical characteristic and a second step of finding a suiting function at least approximately contained in the range of the suiting region by solving simultaneous inequalities, wherein the second step sets the suiting function as a family with certain parameters and finds the range of the parameter values by solving the simultaneous inequalities.

BRIEF DESCRIPTION OF TILE DRAWINGS

DESCRIPTION OF THE PREFERRED EMBODIMENTS

Figure 1:
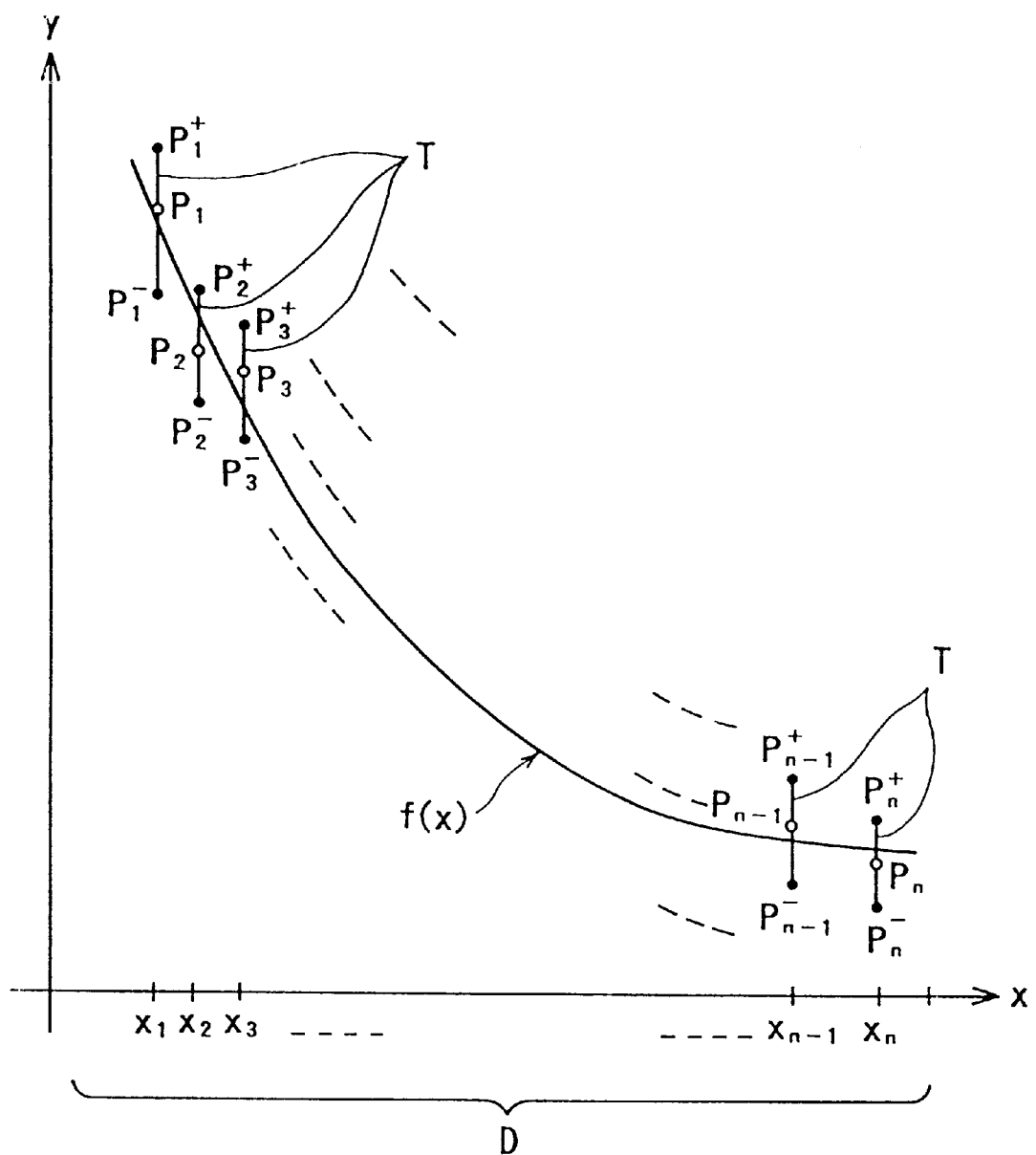
FIG. 1 is a view showing an upper bound function, a lower bound function, and a suiting function of Example 1 of the present invention.

The present invention will be explained below by embodiments.

In the present specification, a physical characteristic means a desired characteristic, desired form, measurement value, communication signal, pattern, etc. Also, in the present specification, a suiting process means a process of deriving a function (hereinafter referred to as a suiting function) which at least approximately passes through a region corresponding to the spread of the input (hereinafter referred to as a suiting region), more concretely parameter values of this suiting function.

This suiting process involves an enormous amount of operations even in a case where the suiting function is expressed in a simple form. Accordingly, it is impossible to find the solution by manual calculation and it first becomes possible by using a digital computer etc. Also, a suiting apparatus means an apparatus for executing the suiting process. Namely, this means a digital computer by which the suiting process is executed etc.

A typical suiting process will be explained below using the vector notation.

A representative example of a suiting process may be expressed as the procedure of setting an appropriate function including parameters as f(x) and finding parameter values satisfying:

$$M^-(x) < f(x) < M^+(x) (\forall x \in D) \qquad (1)$$

on a domain D in a multidimensional space. The inequality system (1) is called a determining inequality system for suiting, and the f(x) that satisfies the inequality system (1) is called a suiting function. Also, $M^+(x)$ which determines the upper bound of the suiting function f(x) is called an upper bound function, and $M^-(x)$ which determines the lower bound is called a lower bound function. The entire range determined by the upper bound function $M^+(x)$ and the lower bound function $M^-(x)$ is called suiting region $T(=\{(x, y) | x \in D, M^-(x) < y < M^+(x)\})$. It is also possible to respectively set values of $+\omega$ and $-\omega$ as the upper bound function $M^+(x)$ and the lower bound function $M^-(x)$.

The inequality system (1) is expressed by a finite number of simultaneous inequalities. The range of the values of the parameters of f(x) that satisfy all of these finite numbers of inequalities is called the solution region. This solution region is obtained by transforming the suiting region to a parameter space. Accordingly, one point in the solution region corresponds to a suiting function with a value within the suiting region.

Note that in the suiting apparatus and suiting process of the present invention, the suiting function f(x) is not only a real function, but also can be a functional, operator, etc., and further can be a recursion formula of a sequence as shown in Example 7. Also, domain D can be a discrete set of points or a continuous range or can be discontinuous.

Moreover, it is also possible that there be a plurality of functions to be suited in so far as the parameters are common. In this case, it is also possible that different suiting regions exist with respect to functions to be suited.

In a following explanation of examples, first, a suiting apparatus and a suiting process of the present invention will be explained by Examples 1 to 4, then an explanation will be made of an application of this apparatus and process to various systems in the art and industry by Example 5 and subsequent examples.

EXAMPLE 1

Here, an explanation will be made of how to obtain a suiting function by a suiting process by the following steps:
1. Reduction of problem of suiting process to inequality system
2. Solution of inequality system
3. Method of determining degree of suiting function f(x)

1 Reduction of Problem of Suiting Process to Inequality System

The suiting method will be explained using FIG. 1. In the present example, the sequences of points $P_j = (x_j, y_j)$ (j=1, 2, . . . , n) are produced based on for example input data. The domain D on the axis x limiting the suiting function becomes $\{x_1, x_2, \ldots, x_n\}$. Considering the spread due to error of the points $P_i$ etc. on $x = x_i$, the upper bound function $M^+(x_i)$ is determined by the upper bound value that can be given by this point $P_i$, and the lower bound function $M^-(x_i)$ is determined by the lower bound value. Such a set up is carried out with respect to the sequences of points $P_i$. Namely, the sequences of points $P^+_1 = (x_1, y^+_1)$, $P^+_2 = (x_2, y^+_2)$, . . . , and $P^+_n = (x_n, y^+_n)$ corresponding to the upper bound functions, and the sequences of points $P^-_1 = (x_1, y^-_1)$, $P^-_2 = (x_2, y^-_2)$, . . . , $P^-_n = (x_n, y^-_n)$ corresponding to the lower bound functions are determined. Note, $y^+_i$ is $M^+(x_i)$, and $y^-_i$ is $M^-(x_i)$. The suiting region T is determined by all of these sequences of points.

Assume that the suiting function can be expressed by a linear rational function in x as:

$$f(x) = (a_0 + a_1 x)/(b_0 + b_1 x) (\forall x \in D) \qquad (2)$$

Here, $a_0$, $a_1$, $b_0$, and $b_1$ are real number parameters.

When the function (2) is substituted in the inequality system (1) and, at the same time, the denominator is canceled under the condition that the denominator $(b_0 + b_1 x_i)$ is positive, the inequality system (1) is transformed to the inequality systems (3), (4), and (5) equivalent to this.

$$-a_0 - a_1 x_i + b_0 M^+(x_i) + b_1 x_i M^+(x_i) > 0 \qquad (3)$$

$$a_0 + a_1 x_i - b_0 M^-(x_i) - b_1 x_i M^-(x_i) > 0 \qquad (4)$$

$$b_0 + b_1 x_i > 0 \qquad (5)$$

So as to display (3), (4), and (5) as inner products of a vector, a parameter space of four dimension, equal to the number of the parameters $a_0$, $a_1$, $b_0$, and $b_1$, is set. The vectors X, $\eta^+(x_i)$, $\eta^-(x_i)$, and $\eta^0(x_i)$ in this parameter space are defined as follows:

$$X = (a_0, a_1, b_0, b_1) \qquad (6)$$

$$\eta^+(x_i) = (-1, -x_i, M^+(x_i), x_i M^+(x_i)) \qquad (7)$$

$$\eta^-(x_i) = (1, x_i, -M^-(x_i), -x_i M^-(x_i)) \qquad (8)$$

$$\eta^0(x_i) = (0, 0, 1, x_i) \qquad (9)$$

X is a parameter vector; $\eta^+(x_i)$ (hereinafter referred to as an upper bound vector) is a vector expressing the limitation by the upper bound function $M^+(x_i)$; $\eta^-(x_i)$ (hereinafter referred to as a lower bound vector) is a vector expressing the limitation by the lower bound function $M^-(x_i)$; and $\eta^0(x_i)$ is a vector expressing the condition necessary for preventing the rational function (2) from divergence.

When using these vectors, the determining inequality system of the suiting process expressed by the inequality systems (3), (4), and (5) becomes the following (10), (11), and (12) expressed by the inner product with the parameter vector X, respectively:

$$(X, \eta^+(x_i)) > 0 \qquad (10)$$

$$(X, \eta^-(x_i)) > 0 \qquad (11)$$

$$(X, \eta^0(x_i)) > 0 \qquad (12)$$

In this way, since the inequality systems (10), (11), and (12) are given to the input point sequences $P_i$ on the domain D, respectively, the problem of finding the suiting function is expressed by a finite number of inequalities, and the solution can be actually found. For example, where the number n of the sequences of points $P_i$ is 500, there are 500 of the inequalities in (10), (11), and (12), respectively.

When the finite number of inequalities obtained with respect to all input sequences of points $P_i$ are simultaneously exhibited and solved for the parameter vector X, the region in which the parameter vector X exists is the solution region S. This solution region S generally becomes a convex cone and is expressed by:

$$S = \{s_1 X_1 + s_2 X_2 + \ldots + s_m X_m | s_1, s_2, \ldots, s_m > 0\} \qquad (13)$$

The vectors of $X_1 = (a_{01}, a_{11}, b_{01}, b_{11})$, $X_2 = (a_{02}, a12, b_{02}, b_{12})$, . . . , $X_m = (a_{0m}, a_{1m}, b_{0m}, b_{1m})$ express the vertices of this solution region S. The suiting function f(x) determined by a point $X_s=(a_{0s}, a_{1s}, b_{0s}, b_{1s})$ inside the solution region S always gives a value within the suiting region T.

2. Solution of Inequality System

Where it is sufficient if one suiting function f(x) is obtained, in many cases, it is sufficient that the subsolution $S_1$ of the solution region S be found. Accordingly, by deciding on the existence of the solution region S and finding only the subsolution $S_1$, the operation can be increased in speed.

Figure 2:
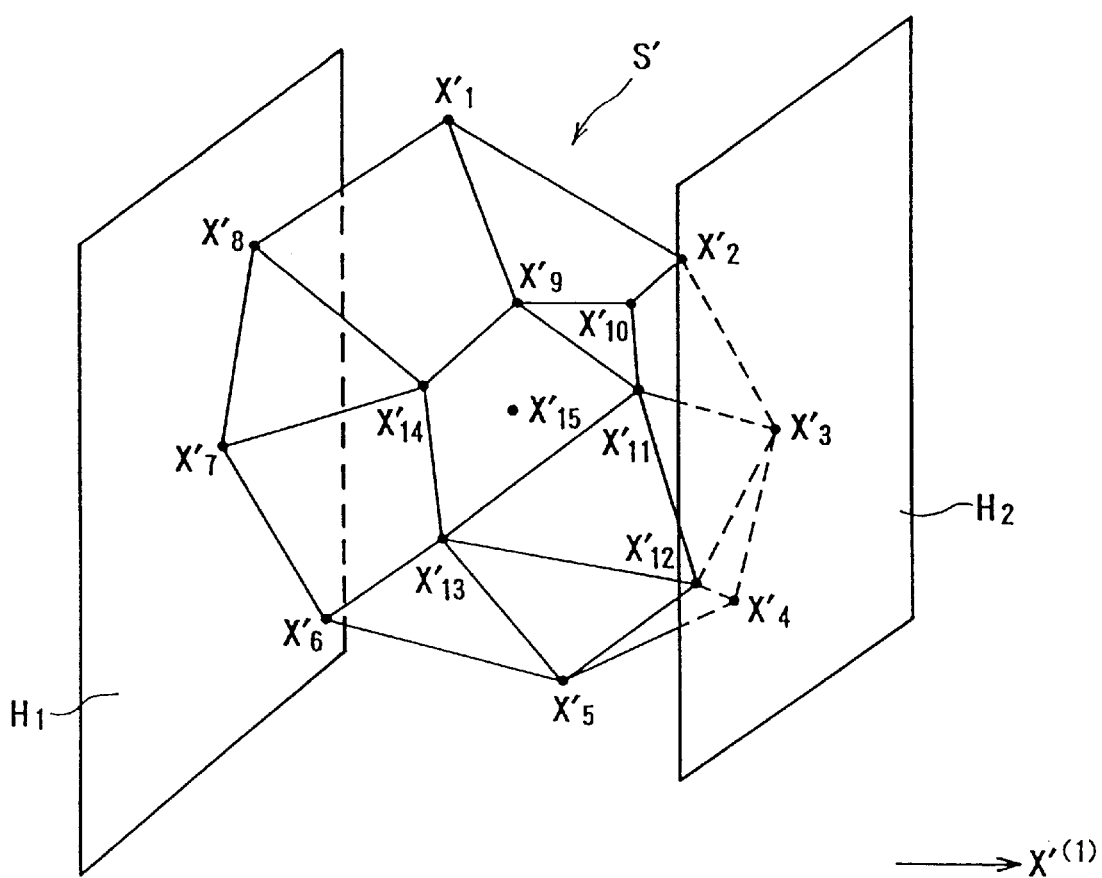
FIG. 2 is a schematic view of a feasible region S' of Example 1 of the present invention.
Figure 3:
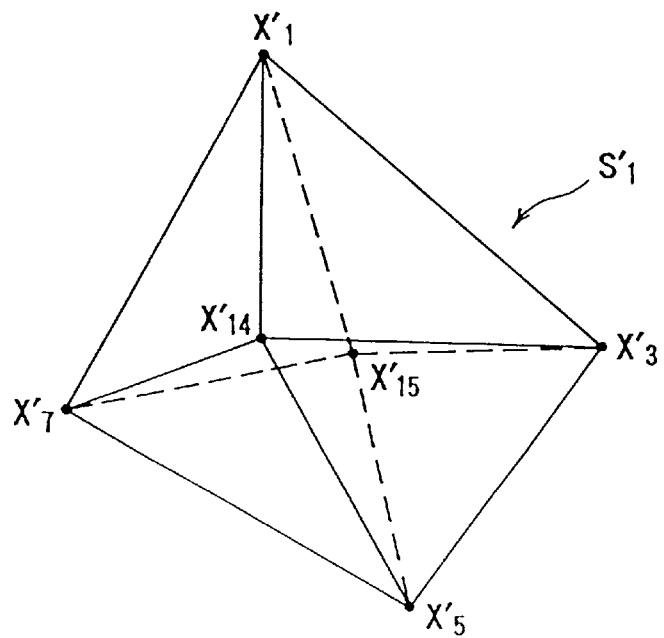
FIG. 3 is a schematic view of a subregion $S'_1$ of the feasible region S' of Example 1 of the present invention.

Referring to FIGS. 2 and 3, one example of the decision of existence of the solution region S utilizing linear programming and finding the partial solution $S_1$ is shown next.

Here, for simplifying the explanation, vectors corresponding to all vectors of $\eta^+(x_i)$, $\eta^-(x_i)$ and $\eta^0(x_i)$ used in the above-mentioned inequality systems (10), (11) and (12) are expressed by $\eta_j$ (j=1, 2, ..., 3n). By this, they are expressed by the following inequality system (14):

$$(X, \eta_j) > 0 \quad (j=1, 2, \ldots, 3n) \tag{14}$$

Here, the following were set:

$$\eta_i = \eta^+(x_i) \quad (i=1, 2, \ldots, n) \tag{15}$$

$$\eta_{i+n} = \eta^-(x_i) \tag{16}$$

$$\eta_{i+2n} = \eta^0(x_i) \tag{17}$$

Also, the display by the component of $\eta_j$ is made $(\eta_{j0}, \eta_{j1}, \eta_{j2}, \eta_{j3})$.

In the inequality system (14), even if the parameter vector X is multiplied by $\alpha$, the following (18) stands:

$$(\alpha X, \eta_j) = \alpha(X, \eta_j) > 0 \tag{18}$$

Therefore, even if X is multiplied by $(1/a_0)$ and set as:

$X''=(1/a_0) X = (1, a_1/a_0, b_0/a_0, b_1/a_0)$ the generality is not lost. Then, the above inequality system (14) expressed by the inner product of the four-dimensional vector is reduced to the following inequality system (19) expressed by the inner product of the three-dimensional vectors X', $\eta'_j$:

$$0 < (X'', \eta_j) = \eta_{j0} + (X', \eta'_j) \tag{19}$$

Here, X' and $\eta'_j$ were set as:
$X'=(X'^{(1)}, X'^{(2)}, X'^{(3)})$
$=(a_1/a_0, b_0/a_0, b_1/a_0)$
$\eta'_j=(\eta_{j1}, \eta_{j2}, \eta_{j3})$ The feasible region S' of the inequality system (19) is expressed by:

$$S'=\{s_1 X'_1 + s_2 X'_2 + \ldots + s_n X'_n | s_1, s_2, \ldots, s_n > 0, s_1+s_2+ \ldots +s_n =1\} \tag{20}$$

$X'_k$ (k=1, 2, ..., n) is a three-dimensional vector expressing the vertex of the feasible region S'.

Under the constraint (19), the objective function is set as $V_1 = X'^{(1)}$ $(=a_1/a_0)$, and $V_1$ is maximized by linear programming. At first, the decision on the existence of a feasible solution is made. It is determined whether the feasible region S' is an empty set. If the feasible region S' is empty, the solution region S is also, and there is no suiting function. When the feasible region S' is not empty, the processing is continued.

An equipotential surface on which $V_1$ is constant is a plane vertical to the axis of $X'^{(1)}$ as expressed by $H_1$, $H_2$, etc. of FIG. 2. It is seen from FIG. 2 that the point of the feasible region S' making $V_1$ maximum is $X'_3$.

Similarly, the following are set:
$V_2 = -X'^{(1)}$ $(=-a_1/a_0)$
$V_3 = -X'^{(2)}$ $(=b_0/a_0)$
$V_4 = -X'^{(2)}$ $(=-b_0/a_0)$
$V_5 = -X'^{(3)}$ $(=b_1/a_0)$
$V_6 = -X'^{(3)}$ $(=-b_1/a_0)$ and the vertices $X'_7$, $X'_1$, $X'_5$, $X'_{14}$, and $X'_{15}$ of the feasible region S' respectively maximizing them are obtained. At this time, if the following is set:

$$S'_1=\{(s_1 X'_3 + s_2 X'_7 + s_3 X'_1 + s_4 X'_5 + s_5 X'_{14} + s_6 X'_{15}) | s_1, s_2, \ldots, s_6 > 0, s_1+s_2+\ldots+s_6=1\} \tag{21}$$

it is seen that $S'_1$ is a subregion contained in the feasible region S' as shown in FIG. 3.

Note that, it is not necessary to restrict the objective function $V_i$ (i=1, 2, ...) to such a method of solution. If a sufficiently large number of objective functions is used, a subregion is obtained.

When considering this in the parameter space, the partial solution $S_1$ is expressed by:

$$S_1 = \{a(1, s_1 X'_3 + s_2 X'_7 + s_3 X'_1 + s_4 X'_5 + \tag{22}$$
$$s_5 X'_{14} + s_6 X'_{15}) | a > 0, s_1, s_2, \ldots, s_6 > 0,$$
$$s_1 + s_2 + \ldots + s_6 = 1\}$$

When the components of one of the parameter vectors existing in this subsolution $S_1$:
$X_{s1}=(a_{0s1}, a_{1s1}, b_{0s1}, b_{1s1})$
are substituted in the right side of (2), one suiting function f(x) is obtained.

Note that, the decision of existence of the solution region S and the finding of the subsolution $S_1$ are not limited to this procedure. The procedure of computational geometry etc. can be used as well. Moreover, it is also possible to find not the subsolution S1, but the whole solution region S by this procedure of computational geometry, etc. (Reference: Computational Geometry: An Introduction. F. P. Preparata and M. I. Shamos, Springer-Verlag, corrected third printing, 1990.) Further, the solution method and approximative solution method using a penalty function etc., can be used. The method by the penalty function is a method of reducing the problem of the inequality to a problem of optimization. Namely, this is a procedure where a penalty function is constructed which gives a large function value on a domain where the inequality is not satisfied and gives a small function value on a domain where the inequality is satisfied and then the point that minimizes this penalty function is found. (Reference: Nonlinear Programming (Part II, Chapter 10), H. Konno and H. Yamashita, Japan Science and Technology Federation, first printing 1978, sixth printing 1990.)

Where it is sufficient if a single suiting function is found, it is also possible to introduce for example one slack variable Y and set the inequality system (19) as:
$0 < (X', \eta_j) + \eta_{j0} - Y$
and to solve the linear programming problem of maximizing Y. If a solution exists and $0 < Y$ is satisfied, X' at that time satisfies the inequality system (19), and therefore one suiting function is obtained. A plurality of procedures for the reduction to the linear programming exist according to the method of introduction of the slack variable.

It is easy to expand the procedures of items 1 and 2 described above with respect to a case where the rational function (2) is generalized to the ratio of linear combinations of two sets of linear independent functions $(p_0(x), p_1(x), \ldots$ .., $p_M(x)$), ($q_0(x)$, $q_1(x)$, ..., $q_N(x)$)) on the domain D in the n-dimensional space:

$$f(x)=(a_0 p_0(x)+a_1 p_1(x)+ \ldots +a_M p_M(x))/(b_0 q_0(x)+b_1 q_1(x)+ \ldots +b_N q_N(x)) \qquad (23)$$

Here, $a_0$, $a_1$, ..., $a_M$, $b_0$, $b_1$, ..., $b_N$ are real parameters, x is an n-dimensional vector, and the functions $p_0(x)$, $p_1(x)$, ..., $p_M(x)$, $q_0(x)$, $q_1(x)$, ..., $q_N(x)$ are piecewisely continuous on D, for example, $x^n$, cos x, $e^x$, and step functions, etc.

3. Method of Determining Degree of Suiting Function f(x)

Figure 4:
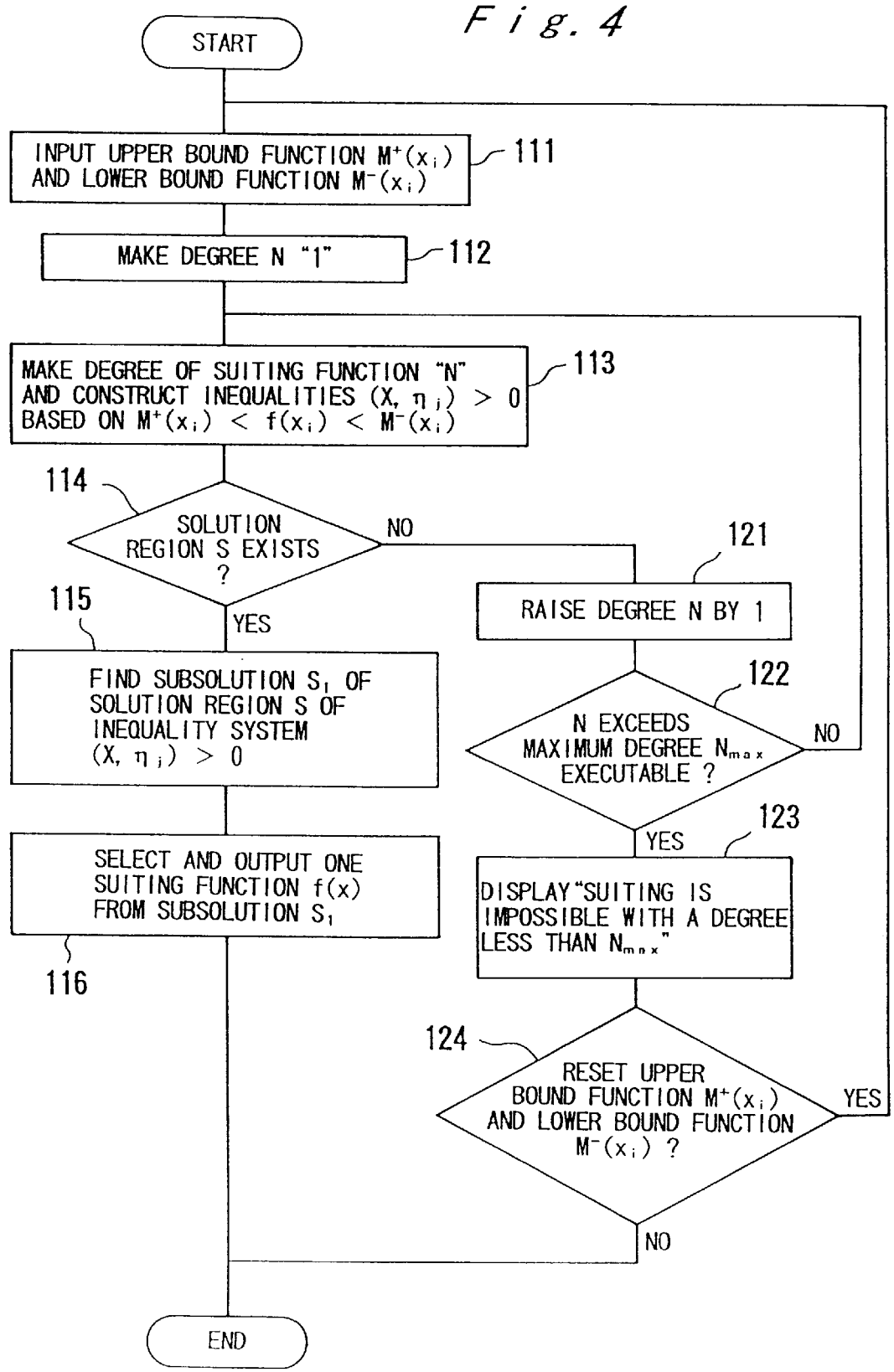
FIG. 4 is a flow chart of Example 1 of the present invention.

FIG. 4 is a flow chart showing one example of a procedure for finding a suiting function by the minimum degree.

Assume that the suiting function f(x) is a rational function in which the denominator and numerator are expressed by the ratio of polynomials of degree n in x. At step 111, the upper bound function $M^+(x_i)$ and the lower bound function $M^-(x_i)$ are input. Namely, considering the allowable range of the respective sequences of points $P_i=(x_i, y_i)$, it is determined that for example the upper bound functions $M^+(x_1)$, $M^+(x_2)$, ..., $M^+(x_n)$ are $1.05y_1$, $1.04y_2$, ..., $1.06y_n$, and the lower bound functions $M^-(x_1)$, $M^-(x_2)$, ..., $M^-(x_n)$ are $0.94y_1$, $0.97y_2$, ..., $0.97y_n$. At step 112, at first the initial value of the degree N is made "1".

At step 113, the inequality system $(X, \eta_j)>0$ is constituted by the above-mentioned procedures. Here, $\eta_j$ is similar to the one used in the inequality system (14). At step 114, the decision of existence of the solution region S of the parameter vector X is carried out.

Here, if the solution region S does not exist, the degree N of the denominator and numerator of the rational function f(x) is raised by one at step 121, At step 122, it is decided whether or not this degree N of the rational function f(x) exceeds the maximum degree $N_{max}$ which can be realized. If it has not exceeded the maximum degree, the routine returns to step 113.

This procedure is repeated, and when it is decided at step 114 that the solution region S exists, the subsolution $S_1$ of the solution region S is found at step 115, and the family of suiting functions f(x) is obtained. At step 116, if necessary, an appropriate suiting function f(x) is selected from the subsolution $S_1$, that is, the family of suiting functions f(x), and displayed on for example a display screen. Thereafter, the program is ended.

At step 122, if it is decided that the degree N exceeds the maximum degree $N_{max}$, it is displayed on the display screen at step 123 that "suiting is impossible with a degree less than $N_{max}$". At step 124, an input of whether or not the upper bound function $M^+(x_i)$ and the lower bound function $M^-(x_i)$ should be reset is awaited.

Where the approximated curve should be produced by a degree less than the maximum degree $N_{max}$, it is necessary to change the setting of the upper bound function $M^+(x_i)$ and the lower bound function $M^-(x_i)$ and to reduce the approximation precision. In this case, the routine returns to step 111, and the setting of the upper bound function $M^+(x_i)$ and the lower bound function $M^-(x_i)$ is changed. For example, the allowable range of the sequences of points $P_i=(x_i, y_i)$ is changed from about ±5% to about ±10%. Thereafter, at step 112, the degree N of the rational function f(x) is set as "1", and the processing of from step 113 to step 122 is repeated. Then, when it is decided at step 114 that the solution region S exists, steps 116 and 117 are executed, and the suiting function f(x) is displayed on the display screen.

On the other hand, at step 124, where the suiting function f(x) to be obtained cannot express the desired specification if for example the suiting region T is expanded, the setting of the upper bound function $M^+(x_i)$ and the lower bound function $M^-(x_i)$ is not changed, and this program is ended.

Note that, the above-mentioned procedure shows an example of the simplest algorithm for the simplification of explanation, and if an algorithm such as for example a well known dichotomy or the like is used, the degree can be determined at a higher speed. Also, the degree N found by the above search is at least one minimum degree of the numerator and denominator. Therefore, by fixing one degree to N and changing the other degree in a range up to N to perform the decision of existence of the solution region S, the respective degrees of the numerator and denominator can be minimized. When performing this, it is sufficient so far as a one-dimensional search is carried out without performing a two-dimensional search with respect to all combinations of the degrees of the numerator and denominator and so the efficiency is high.

As described above, according to the suiting process of the present example, the following effects are obtained. Namely, since the input data is given as a range, input data having a certain spread can be handled, which was conventionally difficult, and the suiting function is not only one, but is found as a family. Accordingly, where the suiting function f(x) of the present example is utilized in a transfer function indicating a circuit structure of for example an analog system mentioned later, if the displacement of the parts of the circuit is put in the range of the solution region S, the transfer function obtained can satisfy a desired specification for a long period without being affected by changes in the circuit along with time etc.

Also, a suiting function can be obtained even by a function difficult to handle by a conventional method such as the optimization method. For example, in the design of an IIR (infinite impulse response) digital filter in which a squared amplitude characteristic is expressed in the form of a rational function, if the suiting process of the present example is used, a desired transfer function can be obtained. In the optimization method, the evaluation function becomes very complicated, and it has been extremely difficult to obtain the optimum value thereof by a numerical solution method such as Newton's method.

Further, the suiting function f(x) giving a value within the suiting region T is obtained by the minimum degree. Also, according to need, by changing the setting of the upper bound function $M^+(x_i)$ and the lower bound function $M^-(x_i)$ on for example a display by a dialogue system, a suiting function f(x) which actually satisfies the specification, that is, is within a range of the maximum degree $N_{max}$ where execution is possible, is obtained by the minimum degree in the suiting region T thereof.

For example, when the suiting process of the present example is utilized for interpolation, the following effects are obtained:

[1] Input sequences of points having error or width can be interpolated.

[2] A rational function can be treated as an interpolation function to be set.

[3] A sharp suiting function without overshoot can be obtained by [2].

[4] The whole can be expressed by one suiting function by [3] not using a piecewise polynomial.

[5] By which degree of function the approximation should be carried out can be calculated.

[6] The interpolation function is obtained as a range, and therefore it is possible to perform fine adjustment within this range.

Note that, the interpolation function here means a function for interpolating data such as the shape of a system, a graphic display, etc.

Also, if the suiting process of the present example is applied to a CAD system etc., it can be utilized for graphic display, shape display, etc.

Further, in the suiting apparatus and suiting process of the present example, if the parameters are common, a plurality of suiting functions can be set. In this case, for the respective suiting functions, different suiting regions can exist. For example, in the present example, if the inequality system (5) necessary for preventing the rational function from divergence is set as:

$$g(x) = b_0 + b_1 x \quad (24)$$

it can be considered that both of f(x) and g(x) are suited. The determining inequality system for suiting in this case is expressed by the inequality system (1) and by:

$$g(x) > 0 \quad (25)$$

(refer to the inequality system (5)).

EXAMPLE 2

Here, an explanation will be made of a case where the suiting function is other than rational.

Where the solution region S in the parameter space can be expressed by a convex region, a function other than the function (23) can be used as the suiting function. Namely, when setting the parameters of the family of functions as $X = (a_0, a_1, \ldots, a_m)$, the upper bound function as $M^+(x)$, the lower bound function as $M^-(x)$, and suiting function as $f(X, x)$, corresponding to the inequality system (1), the following is obtained:

$$M^-(x) < f(X, x) < M^+(x) (\forall x \in D) \quad (26)$$

Here, if the following are set:

$$B_1(X, x) = f(X, x) - M^-(x) \quad (27)$$

$$B_2(X, x) = -f(X, x) + M^+(x) \quad (28)$$

the determining inequality (26) is expressed as follows:

$$0 < B_1(X, x) \quad (29)$$

$$0 < B_2(X, x)(\forall x \in D) \quad (30)$$

In the same way as in Example 1, when the inequalities are evaluated with respect to the input sequences of points $P_i$, a finite number of inequalities are obtained. When these inequalities are simultaneously made to stand and a subsolution is found, the family of suiting functions f(X, x) is found. For this purpose, a procedure in which the part using the linear programming in Example 1 is replaced by non-linear programming can be considered. Namely, it is sufficient if a plurality of objective functions are obtained, the feasible solutions maximizing them are found, and the convex hull of them is made $S_1$. Since it is assumed that the solution region S is convex, this SI becomes a subsolution of the convex hull shape approximating S from the inside. By this, it is also possible to perform the suiting for a function expressing a physical system, etc., which cannot be expressed by a rational function. Also, even in a case where the solution region is not a convex hull, one solution is obtained by solving the inequality systems (29) and (30).

EXAMPLE 3

In Example 3, an explanation will be made of a suiting process in a case where D is a continuous domain, and the upper bound function $M^+(x)$ and the lower bound function $M^-(x)$ are piecewisely continuous by taking as an example the lower bound function $M^-(x)$, in the following order.

Figure 5:
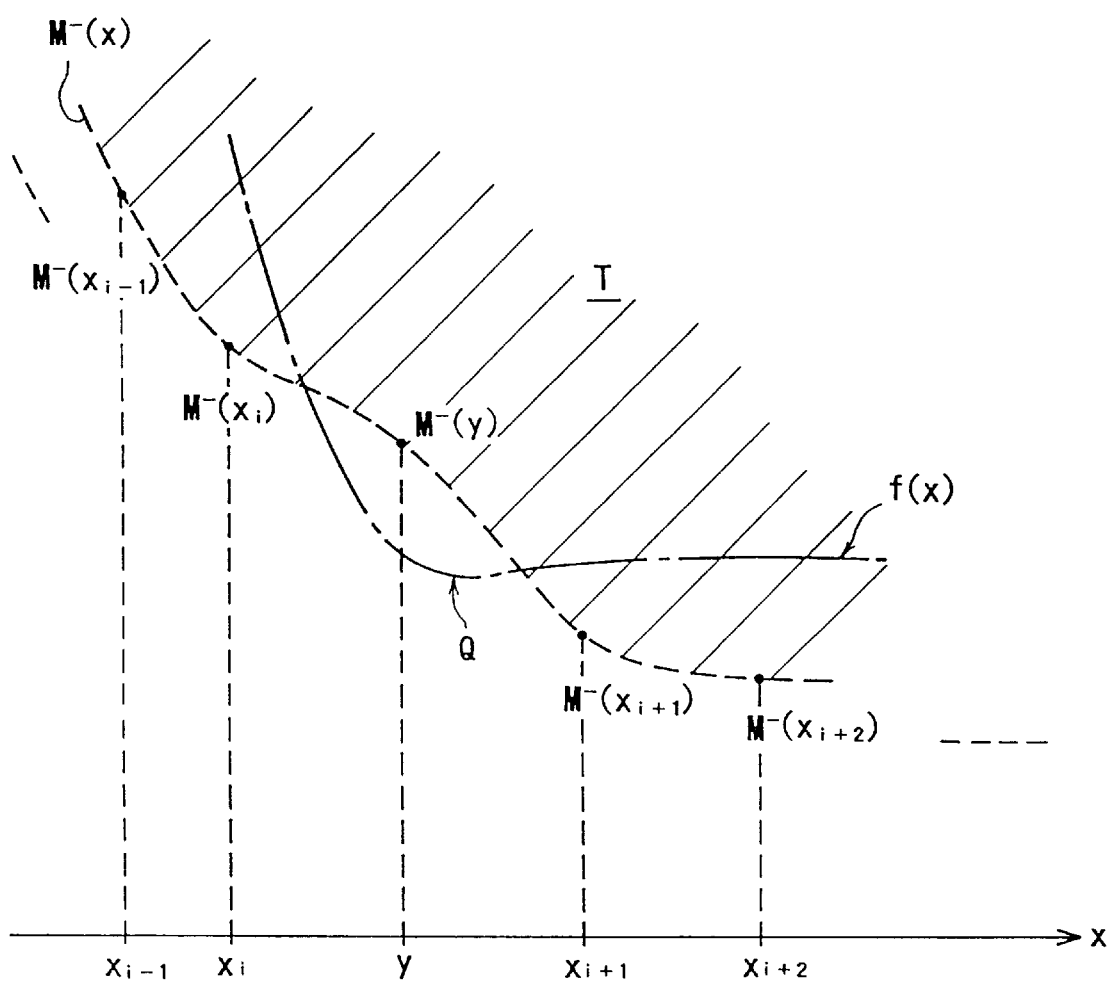
FIG. 5 is a view showing the vicinity of a lower bound function of Example 2.

1. Reduction of continuous suiting process problem using convex hull to simultaneous inequalities
2. Example of method of constituting generating convex hull
3. Other methods Note that, in the present example, the suiting function f(x) is expressed in the form of the rational function (2). Also, as shown in FIG. 5, it is assumed that the lower bound function $M^-(x)$ is expressed by a broken line part of FIG. 5.

1. Reduction of Continuous Suiting Process Problem to Simultaneous Inequalities Using Convex Hull In Example 1, the following inequality system is obtained by the same procedure as that for deriving the inequality (11) in Example 1:

$$(X, \eta^-(x)) > 0 \ (\forall x \in D) \quad (31)$$

This lower bound vector $\eta^-(x)$ is defined from the lower bound function $M^-(x)$ in the same way as in the definition (8), wherein the lower bound function $M^-(x)$ is transformed to the parameter space.

In the case of the present example, x continuously changes, and therefore the inequality system (31) is regarded as an infinite number of simultaneous inequalities. They cannot be handled by an apparatus such as a digital computer. Therefore, the inequality system (31) is approximated by a finite number of simultaneous inequalities by the procedure using the convex hull mentioned next.

The interval D is divided into a finite number of intervals $[x_1, x_2], [x_2, x_3], \ldots, [x_{n-1}, x_n]$ having an appropriate size in accordance with the desired precision.

Figure 6:
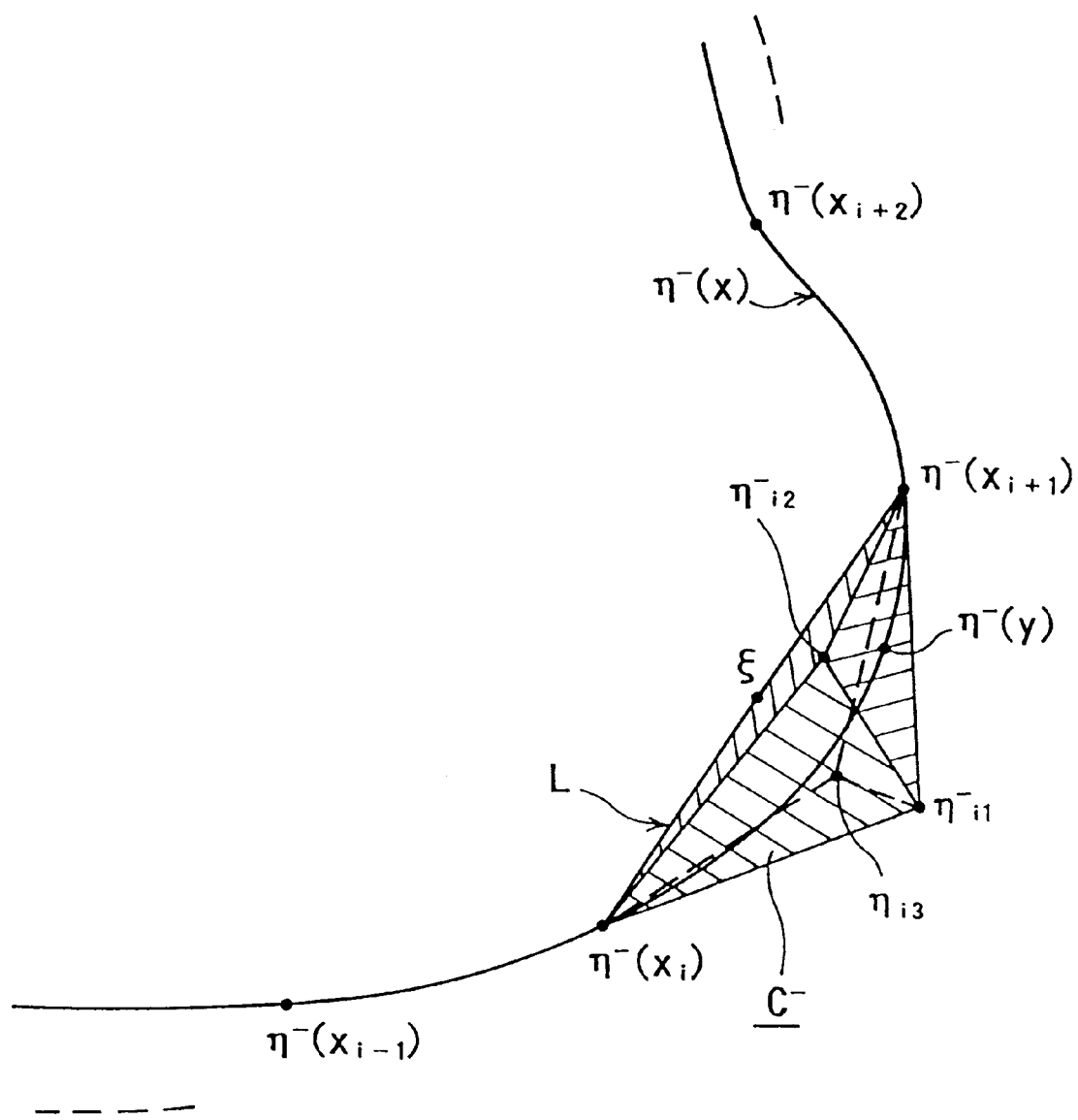
FIG. 6 is a view showing a generating convex hull encompassing the lower bound function $M^-(x)$ of Example 3 of the present invention.

In FIG. 6, the lower bound function $M^-(x)$ and the points $M^-(x_i)$ and $M^-(x_{i+1})$ have been transformed to the lower bound vectors $\eta^-(x), \eta^-(x_i),$ and $\eta^-(x_{i+1})$, respectively. Also, $M^-(y)$ corresponding to an arbitrary point y on the interval $[x_i, x_{i+1}]$ corresponds to the lower boundary vector $\eta^-(y)$.

First, a procedure for approximating the lower bound vector $\eta^-(y)$ by a convex hull will be explained referring to FIGS. 5 and 6, Considered a case where a certain parameter vector $X_0$ satisfies the following with respect to the lower bound vectors $\eta^-(x_i)$ and $\eta^-(x_{i+1})$:

$$(X_0, \eta^-(x_i)) > 0 \quad (32)$$

$$(X_0, \eta^-(x_{i+1})) > 0 \quad (33)$$

With respect to an arbitrary vector $\xi$ on a line segment L connecting $\eta^-(x_i)$ and $\eta^-(x_{i+1})$, the formula of the line segment:

$$\xi \in \{s_1 \eta^-(x_i) + s_2 \eta^-(x_{i+1}) | s_1, s_2 > 0, s_1 + s_2 = 1\} \quad (34)$$

stands. Accordingly, $(X_0, \xi)$ is expressed as:

$$(X_0, \xi) = s_1(X_0, \eta^-(x_i)) + s_2(X_0, \eta^-(x_{i+1})) \quad (35)$$

Since $s_1, s_2 > 0$, $$(X_0, \xi) > 0 \quad (36)$$

stands from the inequalities (32) and (33). However, concerning the point y on the interval $[x_i, x_{i+1}]$, that is the lower bound vector $\eta^-(y)$ not present on the line segment L, there is no guarantee that the following always stands:

$$(X_0, \eta^-(y)) > 0 \ (y \in [x_i, x_{i+1}]) \quad (37)$$

Since $\eta^-(y)$ expresses the lower bound function, an arbitrary point of the rational function f(x) in the interval $[x_i, x_{i+1}]$ of FIG. 5 is not always located higher than the lower bound function M⁻(x).

Here, so as to make the inequality system (37) always stand, the lower bound vector $\eta^-(y)$ is approximated by the convex hull C⁻. Here, the convex hull is defined such that a line segment connecting two arbitrary points inside the same is always contained in the internal portion thereof.

It is made so that the convex hull C⁻ encompasses an arbitrary lower bound vector $\eta^-(y)$ on the interval $[x_i, x_{i+1}]$, that is, the following always stands:

$$\eta^-(y) \in C^- \tag{38}$$

Here, this is called the generating convex hull. At this time, the generating convex hull C⁻ is expressed for example as follows (hatching part of FIG. 6):

$$C^- = \{s_1\eta^-(x_i) + s_2\eta^-(x_{i+1}) + s_3\eta^-_{i1} + s_4\eta^-_{i2} + \tag{39}$$

$$s_5\eta^-_{i3}|s_1, s_2, s_3, s_4, s_5 > 0,$$

$$s_1 + s_2 + s_3 + s_4 + s_5 = 1\}$$

The method of determination of this generating convex hull C⁻ will be explained in detail below.

Next, an explanation will be made of a procedure for approximating the inequality system (37) with an infinite number of inequalities on the interval $[x_i, x_{i+1}]$ by a finite number of inequalities. The inequality system (37) is replaced by the following inequality system (40):

$$(X, C^-) > 0 \text{ (i.e. } \forall \eta^- \in C^-, (X, \eta^-) > 0) \tag{40}$$

By the definition of the convex hull, the inequality system (40) becomes equivalent to the following simultaneous inequalities (41) to (45):

$$(X, \eta^-(x_i)) > 0 \tag{41}$$

$$(X, \eta^-(x_{i+1})) > 0 \tag{42}$$

$$(X, \eta^-_{i1}) > 0 \tag{43}$$

$$(X, \eta^-_{i2}) > 0 \tag{44}$$

$$(X, \eta^-_{i3}) > 0 \tag{45}$$

By a similar calculation as the calculation of the inequalities (32) to (36), the parameter vector X which is the solution of these simultaneous inequalities satisfies $(X, \eta^-) > 0$ where $\eta'$ is an arbitrary element of C⁻. Also, since the relation (38) has been realized, the inequality system (37) stands. When considering this by the original graph, it means that on the interval $[x_i, x_{i+1}]$, the suiting function f(x) corresponding to this X is always located above the lower bound function M⁻(x) in FIG. 5.

In the same way as the inequalities (41) to (45), if the inequalities are established for every divided interval, the decision of existence of the solution region and finding of a solution are carried out by the method of solution of inequality systems similar to those in Example 1, and the suiting functions are found.

As described above, in the present example, in addition to the fact that an effect similar to Example 1 is obtained, the following effects are obtained. First, even in a case where the upper bound function M⁺(x) and the lower bound function M⁻(x) are given as the piecewise continuous functions, the inequality system (31) is reduced to a finite number of inequalities using the generating convex hull, whereby the calculation of suiting becomes possible.

Also, since the generating convex hull is used, the suiting function f(x) is prevented from protruding to below the lower bound function M⁻(x) as Q in FIG. 5. By this, even in a case where the suiting function is a rational function of higher degree and the function value fluctuates vigorously depending on the value of the independent variable, it is guaranteed that it is contained in a continuous suiting region T.

Further, it is also possible that the generating convex hull absorbs the error, deviation, etc. of the upper bound function or the lower bound function. Such a function is utilized in Example 7.

Note that, the respective intervals are determined so as not to be superimposed on each other, and it is also possible even if they have different sizes. For example, a part for which the precision is particularly required, for example, where the fluctuation of the function is large, is preferably divided into fine sections. Also, it is not necessary to divide the upper bound function M⁺(x) and the lower bound function M⁻(x) using the same interval. They can be set up in accordance with their respective requests.

2. Example of Method of Constituting Generating Convex Hull

Referring to FIG. 7 to FIG. 10, an explanation will be made of some algorithms for constituting the generating convex hull C which covers one part of the curve $\eta(x)$. Here, the parameter space is two-dimensionally illustrated for simplification, but its dimension is in actuality equal to the number of the parameters of the suiting function f(x). The curve $\eta(x)$ corresponds to for example the lower bound vector $\eta^-(y)$ of example 3.

i) Procedure A

Figure 7:
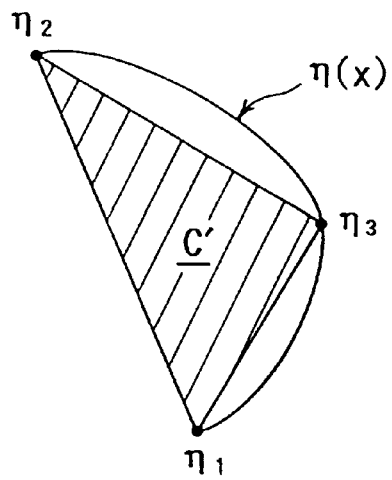
FIG. 7 is a view showing an initial state of a step of constructing the generating convex hull by a procedure A of Example 3 of the present invention.
Figure 8:
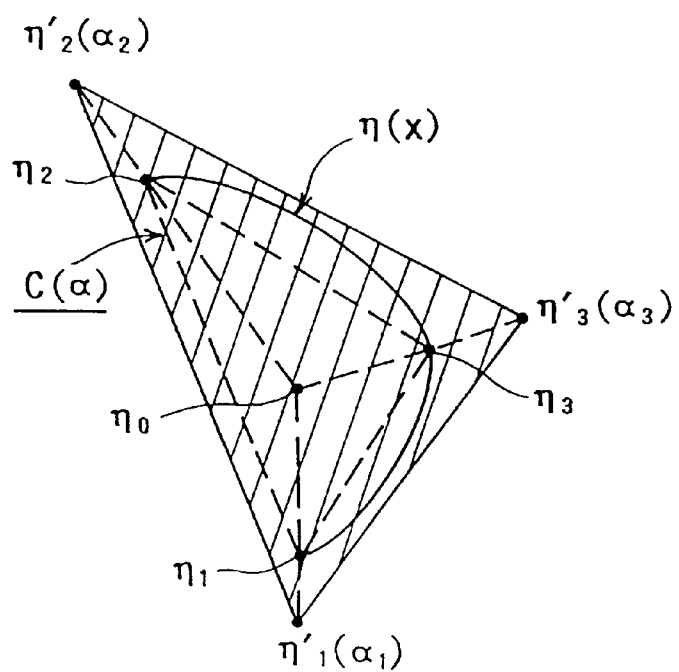
FIG. 8 is a view showing an end state of a step of constructing the generating convex hull by the procedure A.

As shown in FIG. 7, a point on the curve $\eta(x)$ or points $\eta_1, \eta_2, \ldots, \eta_m$ in the neighborhood of the curve $\eta(x)$ are taken at an appropriate pitch, and a convex hull C' using them as the vertex (hatching part in FIG. 7, m=3 was set in the figure) is produced. As shown in FIG. 7, this convex hull C' does not always contain the curve $\eta(x)$. Therefore, as shown in FIG. 8, an inner point $\eta_0$ of the convex hull C' is taken, and the convex hull C' is expanded with this inner point $\eta_0$ as the center.

$$\eta'_i(\alpha_i) = \alpha_i (\eta_i - \eta_0) + \eta_0 \tag{46}$$

Note, i=1, 2, ..., m $\alpha = (\alpha_1, \alpha_2, \ldots, \alpha_m)$

Here, $\alpha_i$ is the parameter of expansion. The convex hull using these $\eta'_1(\alpha_1), \eta'_2(\alpha_2), \ldots, \eta'_m(\alpha_m)$ as the vertex is set as $C(\alpha)$ (hatching part of FIG. 8).

Each $\alpha_i$ is gradually increased, and when the convex hull $C(\alpha)$ covers all of the $\eta(x)$, the increase thereof is stopped. The convex hull $C(\alpha)$ at this time is defined as the generating convex hull C.

Note that, not only by increasing $\alpha_i$, but also by combining the increase and decrease, $\alpha_i$ covering the curve $\eta(x)$ can be determined at a higher speed. For example, by using the dichotomy, each $\alpha_i$ is changed while decreasing the width changed for every step, and it is decided for each step whether the convex hull $C(\alpha)$ contains the curve $\eta(x)$. If $\alpha$ is within the predetermined precision where it contains the curve $\eta(x)$, this change is stopped. The convex hull $C(\alpha)$ at this time is defined as the generating convex hull C.

Moreover, it is also possible that a plurality of inner points $\eta_0$ exist.

ii) Procedure B

Figure 9:
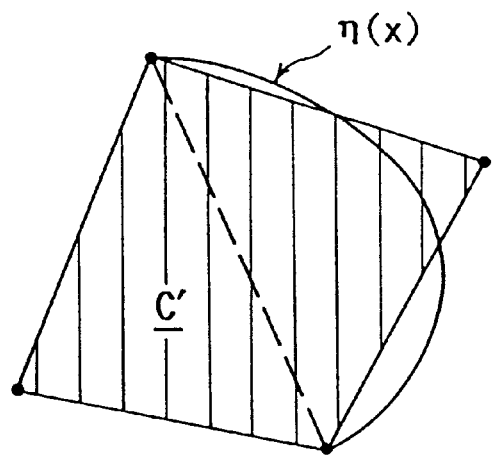
FIG. 9 is a view showing a step of constructing the generating convex hull by a procedure B.

As shown in FIG. 9, an appropriate form which can contain a curve as the initial convex hull C', for example a polyhedron containing both ends of the curve $\eta(x)$, or one obtained by combining a plurality of them are determined. In the same way as the procedure A, the convex hull C' is expanded to contain the curve η(x).

iii) Procedure C

Figure 10:
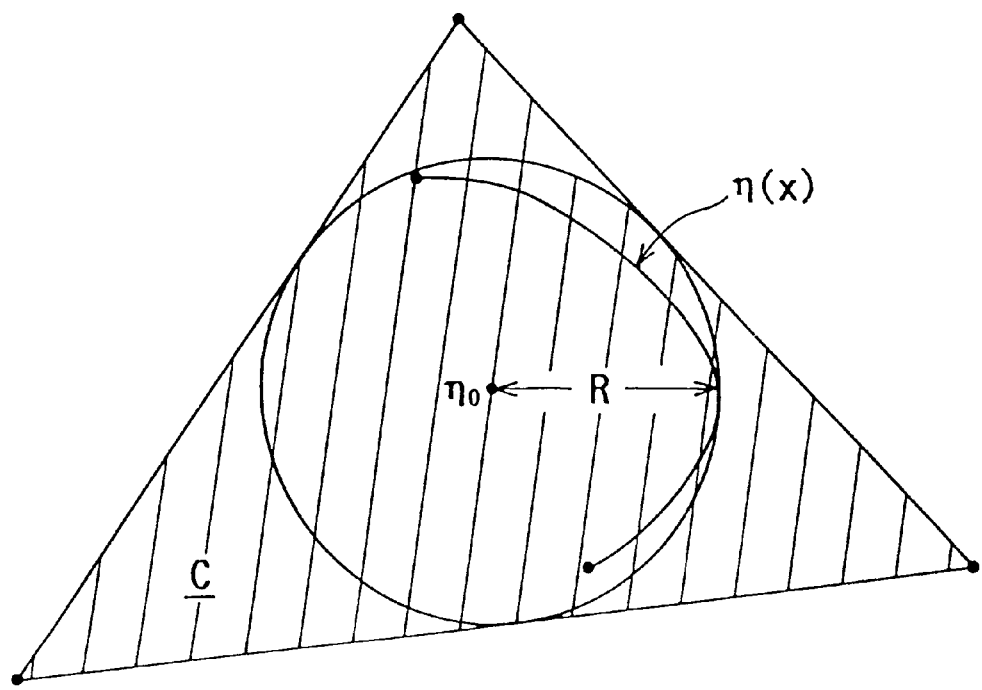
FIG. 10 is a view showing a step of constructing the generating convex hull by a procedure C.

As shown in FIG. 10, one point $\eta_0$ in the neighborhood of the curve η(x) is taken. A distance between this $\eta_0$ and respective points on the curve η(x) is calculated, and the maximum one is set as R. A convex polyhedron C circumscribing the sphere having a center $\eta_0$ and a radius R is formed, and this is defined as the generating convex hull C.

Note that, the procedure of producing the generating convex hull is not limited to the above-described procedures A to C, and a procedure which is conventionally well known by computational geometry etc. can be adopted.

Note that, the method having the present structure concerns a convex hull approximating a curve, but even in a case where x is in a high-dimensional space, that is, even in a case of a high dimensional suiting in which η(x) expresses a curved plane etc., it can be applied as it is.

3. Other methods

The procedure for obtaining a finite number of inequalities where the upper bound function $M^+(x)$ and the lower bound function $M^-(x)$ are piecewise continuous functions is not limited to the above-mentioned procedures. For example, also a procedure approximating the upper bound function $M^+(x)$ and the lower bound function $M^-(x)$ by a dense sequence of points can be adopted. There also exists a case where a protrusion is removed by slightly correcting the suiting function according to need. For example, where the suiting function f(x) is rational in x and it projects over the upper bound function $M^+(x)$ in the interval $[x_i, x_{i+1},]$, $E(x)=M^+(x)-f(x)$ has an even number of real zeros in this interval. Therefore, if the parameters of the f(x) are expressed by the zeros of E(x), the above-described real zeros are determined as sets each consisting of two, the position is slightly corrected so that each set becomes a set of complex conjugate purely imaginary zeros, and the parameter of f(x) is reconstructed from them, it is possible to remove just the protrusion while holding the form of the suiting function almost as it is. This procedure can be applied not only to a case where D is the range on the real axis, but also to a case where it is a one-dimensional domain, i.e., a part of a unit circle on the complex plane.

EXAMPLE 4

Figure 11:
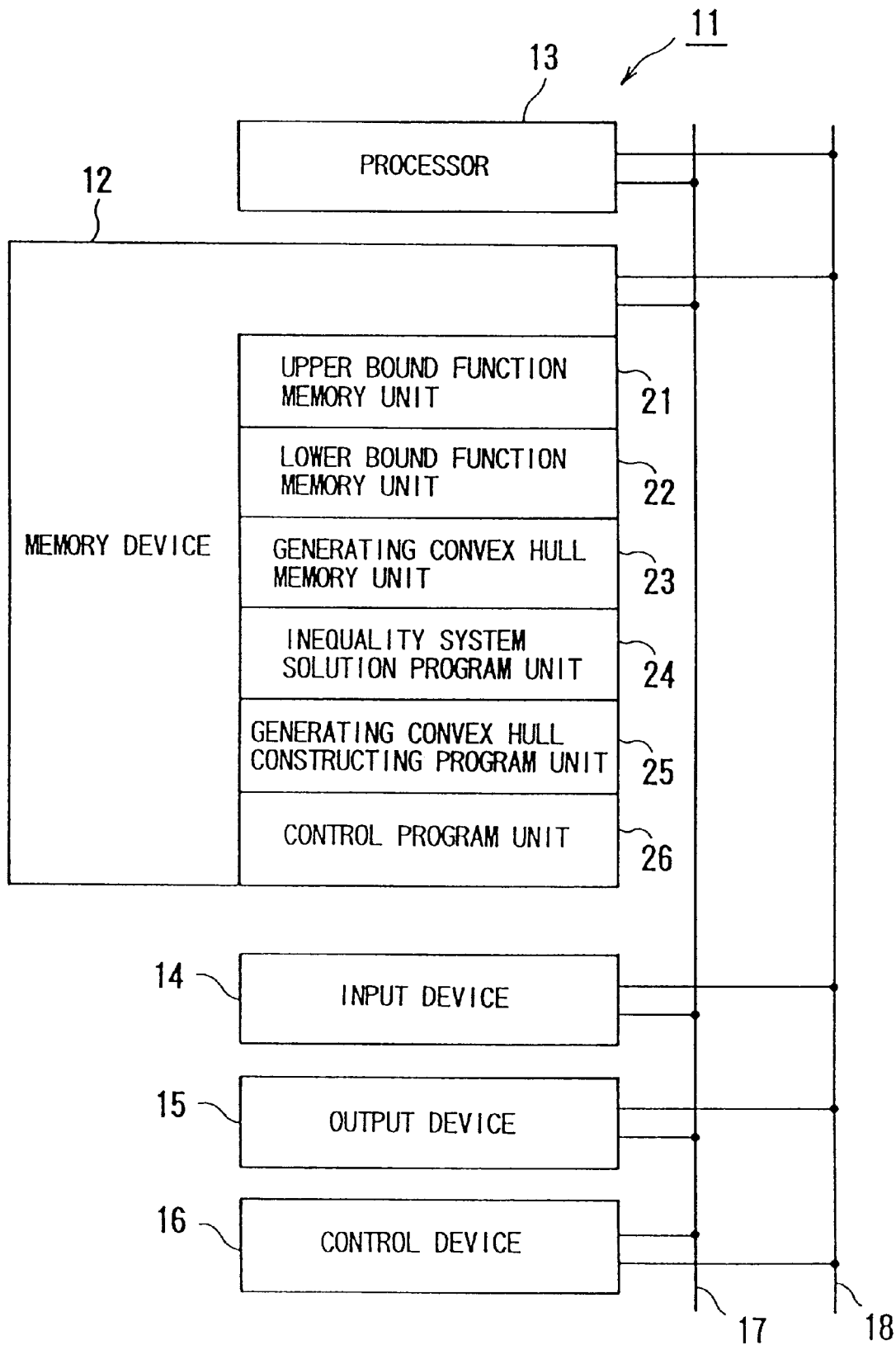
FIG. 11 is a schematic view showing an apparatus for executing the suiting process of Example 4 of the present invention.

FIG. 11 shows a schematic structure of an apparatus which executes the suiting process as Example 4. The suiting apparatus of the present invention will be explained referring to FIG. 11.

This apparatus 11 is for example a digital computer and has a memory device 12, a processor 13, an input device 14, an output device 15, and a control device 16, These are mutually connected by bus lines 17 and 18, The memory device 12 is provided with a region for storing the upper bound function $M^+(x)$, that is, the upper bound function memory unit 21, a region for storing the lower bound function $M^-(x)$, that is, the lower bound function memory unit 22, a region for storing the generating convex hull, that is, the generating convex hull memory unit 23, a region for storing an inequality system solution program, that is, the inequality system solution program unit 24, a region for storing the generating convex hull constructing program, that is, the generating convex hull constructing program unit 25, and a region for storing a control program such as an OS, that is, the control program unit 26, The processor 13 is a CPU etc. The input device 14 is for example a keyboard, mouse, a number file, a digitizer, or a light pen. The output device 15 is for example a display, a number file, plotter, or printer. The control device 16 controls the respective devices for executing the program.

Figure 12:
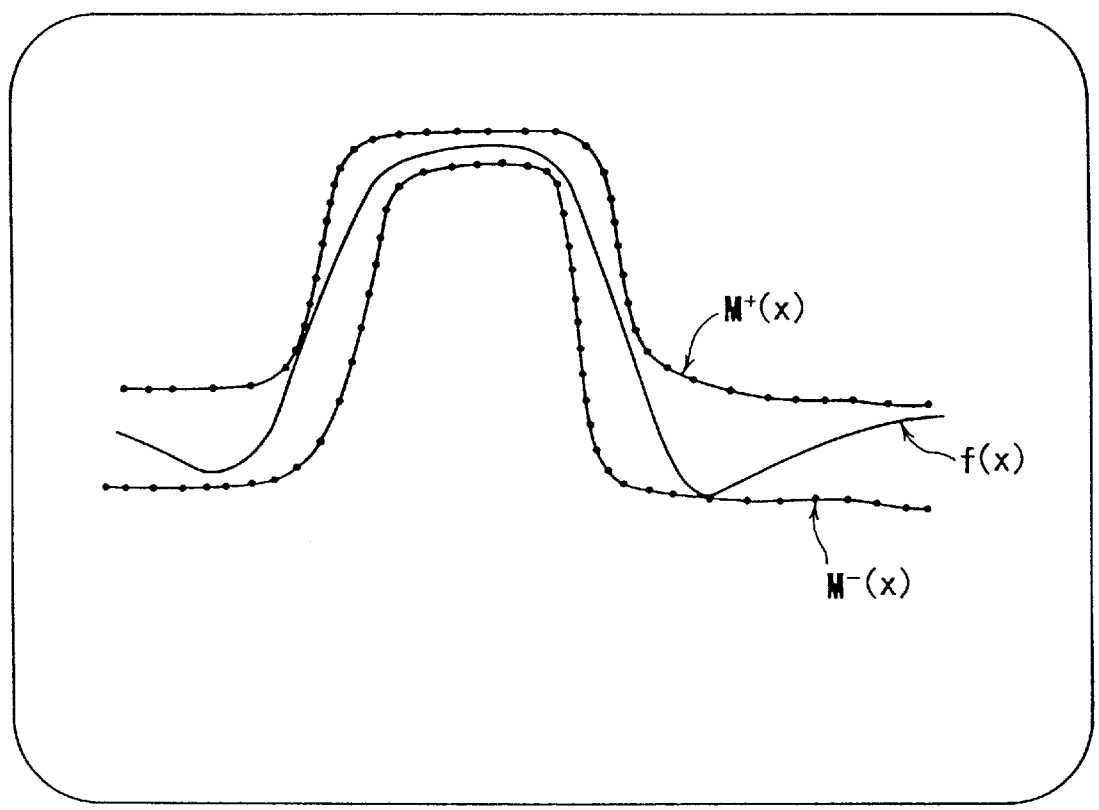
FIG. 12 is a view of a squared amplitude characteristic obtained in Example 4 of the present invention.

FIG. 12 shows an example of the data displayed on the screen of a display of the output device 15. The upper bound function $M^+(x)$ and the lower bound function $M^-(x)$ are set based on the sequence of points given via the input device 14. In the suiting function f(x) found by the suiting process, the denominator and numerator are respectively expressed by the rational function (47) expressed by the fourth-degree polynomials:

$$f(x)=(A_0+A_1x+A_2x^2+A_3x^3+A_4x^4)/(B_0+B_1x+B_2x^2+B_3x^3+B_4x^4) \quad (47)$$

Here, $A_0$, $A_1$, $A_2$, $A_3$, $A_4$, $B_0$, $B_1$, $B_2$, $B_3$, and $B_4$ are real number parameters.

This function (47) indicates the squared amplitude characteristic of the digital band pass filter. It will be mentioned in detail in Example 5 that the transfer function of the digital filter is obtained from the function (47).

As described above, according to the suiting apparatus of Example 4, effects similar to those of Example 3 are obtained.

Also, the suiting apparatus of Example 4 has a structure for visually displaying the upper bound and lower bound of the suiting region on the screen of the display and, at the same time, displaying the suiting function f(x) on this displayed suiting region in an overlapping manner. Accordingly, the spread of the input data and correspondence between that spread and the results of processing of the suiting process can be directly and visually understood, and therefore where the suiting process is utilized for example for a design system, the design becomes easy, and the effect that a change of specifications and a change of design can be efficiently carried out is obtained.

EXAMPLE 5

Here, an explanation will be made of a case where the suiting process of the present invention is applied to the design of a digital filter as one example of the digital signal processing system. A digital filter can be classified as an IIR filter or an FIR (finite impulse response) filter. The design of the conventional IIR filter has problems such that: [1] it handles only a rectangular characteristic and it is difficult to handle any characteristic, [2] many calculation methods for determining the ripple characteristic of the respective bands and delay characteristic must be separately used according to the case, and for a FIR filter, there is a problem such that [3] a deterioration of the characteristic due to the window function occurs. Further, as problems common to the two, there were problems that [4] it is not generally guaranteed that the characteristic is in the expected range, [5] a deterioration of the characteristic due to the quantization error of a coefficient cannot be compensated for, [6] the degree of the system becomes excessive over the minimum degree that can realize the desired characteristic.

When the suiting process of the present invention is used, the above-described problems are solved, and the digital filter can be designed with any characteristic and by the minimum degree so that it is put in the desired range of characteristic. An explanation will be made below of the design of a digital filter in the following order. For ease of explanation, the sampling period T is normalized to "1", but generalization can be easily carried out also for other periods. Also, the phase characteristic and the arguments are indicated in an unwrapped form and are expressed by a continuous multiple rotation angle over the range of from 0 to 2π.

1. Design of amplitude characteristic of digital filter having rational transfer function
2. Design of characteristic of digital filter having polynomial transfer function and all pole transfer function
    (1) Design of characteristics simultaneously designating amplitude and phase
    (2) Design of phase characteristic
    (3) Design of amplitude characteristic of complete linear phase FIR filter
3. Design of all pass filter 1. Design of Amplitude Characteristic of Digital Filter Having Rational Transfer Function First, for a digital filter in which the transfer function is expressed in the form of a rational function, the design is carried out by designating only the amplitude characteristic while ignoring the phase characteristic. The domain $D_0$ requiring the characteristic is set as:

$$D_0 = \{0 \leq \omega \leq \pi\} \tag{48}$$

The degree of the transfer function can be arbitrarily set, but an explanation will be made of a case where both of the numerator and denominator are polynomials of degree four.

The transfer function $H(z)$ is defined as:

$$H(z) = (a_0 + a_1 z^{-1} + a_2 z^{-2} + a_3 z^{-3} + a_4 z^{-4}) / \tag{49}$$
$$(b_0 + b_1 z^{-1} + b_2 z^{-2} + b_3 z^{-3} + b_4 z^{-4})$$
$$= P(z)/Q(z)$$

and the numerator and denominator are set as $P(z)$ and $Q(z)$, respectively, as described above. The function (49) indicates the transfer function of the IIR filter, but in the case of an FIR filter, it is sufficient if $Q(z)=b_0$ is set.

For convenience of calculation, it is assumed that the amplitude characteristic is indicated by a squared amplitude characteristic. The squared amplitude characteristic of the filter is defined as $H(e^{jw})H^*(e^{jw})$ as in the following equation by substituting $z=e^{jw}$ in the function $H(z)$ (* expresses the complex conjugate).

$$H(e^{jw})H_*(e^{jw}) = H(e^{jw})H(e^{-jw}) \tag{50}$$
$$= (A_0 + A_1 \cos\omega + A_2 \cos^2\omega + A_3 \cos^3\omega + A_4 \cos^4\omega)/$$
$$(B_0 + B_1 \cos\omega + B_2 \cos^2\omega + B_3 \cos^3\omega + B_4 \cos^4\omega)$$

The squared amplitude characteristic is expressed as a function of $\cos \omega$ as in the above equation. These numerators and denominators are set as $p(\cos \omega)$ and $q(\cos \omega)$, respectively and $f(\cos \omega)=p(\cos \omega)/q(\cos \omega)$ is set. $A_0, A_1, A_2, A_3$, and $A_4$ are expressed as the quadratic polynomials of $a_0, a_1, a_2, a_3$, and $a_4$, and $B_0, B_1, B_2, B_3$, and $B_4$ are expressed as the quadratic polynomials of $b_0, b_1, b_2, b_3$, and $b_4$. Note that, an explanation is made here of $\cos^k\omega$ as the base function, but the base function is not limited to this. For example, it is also possible to perform the suiting on $D_0$ using $\cos k\omega$ (k=0, 1, . . . , 4) as the base function.

The upper bound function $M^+(\cos \omega)$ and the lower bound function $M^-(\cos \omega)$ expressing the desired range of the squared amplitude characteristic on the domain $D_0$ are given. On $D_0$, $\cos \omega$ takes a value of from "1" to "−1", and therefore when it is defined as $x=\cos \omega$, $D=\{-1 \leq x \leq 1\}$ and the suiting is carried out according to the following determining inequality system:

$$M^+(x) < f(x) = p(x)/q(x) < M^-(x)(x \in D) \tag{51}$$

$$0 < q(x)(x \in D) \tag{52}$$

Here, the positive-valued condition of $q(x)$ is necessary for the stabilization of the filter. From the above equation, the parameters $A_0, A_1, A_2, A_3$, and $A_4$ and $B_0, B_1, B_2, B_3$, and $B_4$ are found by the already explained suiting procedure. The corresponding transfer function $P(z)/Q(z)$ is found in the following way from the thus obtained squared amplitude characteristic $p(x)/q(x)$.

At first, the conversion from the denominator $q(x)$ to the denominator $Q(z)$ of the transfer function is carried out as follows. $q(x)$ is subjected to factorization over the real number field by the numerical solution of the higher algebraic equation etc. and by the product of a linear factor $q_i(x)=\alpha_i+\beta_i x$ and the quadratic factor $q_j(x)=\alpha_j+\beta_j x+\gamma_j x^2$ $(i,j \leq 4)$, $$q(x)=q_1 q_2 \ldots q_m (m \leq 4) \tag{53}$$

is expressed. Here, each $q_k$ is taken so as to become positive on D. The linear transfer function where the squared amplitude characteristic becomes $q_i(\cos \omega)$ is defined as $Q_i$ and the quadratic transfer function where the squared amplitude characteristic becomes $q_j(\cos \omega)$ is defined as $Q_j$. They are easily obtained by solving the simultaneous quadratic algebraic equations. At this time, $$Q(z)=Q_1(z)Q_2(z) \ldots Q_m (m \leq 4) \tag{54}$$

is the denominator of the transfer function to be found. Also $P(z)$ is similarly found.

There are a plurality of $Q_k$ and $P_k$ (k=1, 2, . . . m) corresponding to the respective $q_k$ and $P_k$, and $Q_k$ is selected from among them so as to satisfy the filter stabilization condition (that every pole of $H(z)$ is inside the unit circle). This selection is always possible by imposing the condition that $0<q(x)$. When the $Q_k$ and $P_k$ to be selected are different, the phase characteristic differs, but conversely the phase characteristic near the desired one can be realized by appropriately selecting $Q_k$ and $P_k$. Of course the above method can be applied also to a higher degree filter. Also, the procedure of factorizing $q(x)$ and converting the same to $Q(z)$ as described above is merely one example of a method of finding the transfer function and for facilitating the calculation, and it is also possible to find the same by another method. For example, it is also possible to directly find $b_0, \ldots, b_4$ from $B_0, \ldots, B_4$ by the appropriate numerical solution of the high dimensional algebraic equation.

2, Design of Characteristic of Digital Filter Having Polynomial Transfer Function and All Pole Transfer Function Here, an explanation will be made of the design of a FIR filter in which the transfer function $H(z)$ is a polynomial of $z^{-1}$ and the all pole filter in which $H^{-1}(z)$ is a polynomial of $z^{-1}$.

(1) Design of Characteristics Simultaneously Designating Amplitude and Phase

First, an explanation will be made of a design in which both of the amplitude and phase are designated. It is assumed that the domain for suiting is $D_0$ of definition (48). The transfer function of the FIR filter is defined as:

$$H(z)=a_0+a_1 z^{-1}+a_2 z^{-2}+ \ldots +a_n z^{-n} \tag{55}$$

and the upper bound and lower bound functions of amplitude and phase are set as $M^+(\omega)$, $M^{-(\omega)}$, $\theta^+(\omega)$, and $\theta^-(\omega)$, respectively. For the input of them, it is also possible to enable the input by drawing a graph on a CRT screen using a mouse and keyboard or enable a direct input of a numerical equation. Of course, also a file input can be adopted.

Further, the following are set:

$$M_c(\omega)=(M^+(\omega)+M^-(\omega))/2 \quad (56)$$

(intermediate value of the upper bound and lower bound of amplitude)

$$\theta_c(\omega)=(\theta^+(\omega)+\theta^-(\omega))/2 \quad (57)$$

(intermediate value of the upper bound and lower bound of phase)

$$\Delta M(\omega)=(M^+(\omega)-M^-(\omega))/2 \quad (58)$$

(half value of amplitude allowance)

$$\Delta\theta(\omega)=(\theta^+(\omega)+\theta^-(\omega))/2 \quad (59)$$

(half value of phase allowance)

$$I_H(\omega)=\operatorname{Im}(H(e^{j\omega})) \quad (60)$$

(imaginary part of transfer function)

$$R_H(\omega)=\operatorname{Re}(H(e^{j\omega})) \quad (61)$$

(real part of transfer function)

Figure 13:
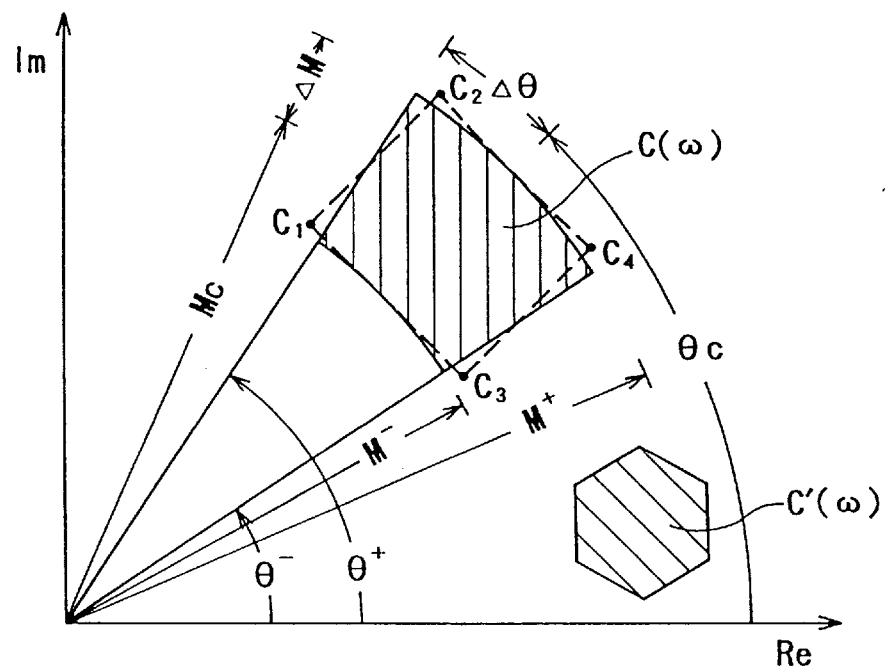
FIG. 13 is a view explaining a design of a digital filter which simultaneously designates the amplitude characteristic and phase characteristic in Example 5 of the present invention.

The suiting region in this case is the left hatching part in FIG. 13. If $\Delta\theta$ is not that large, the suiting region can be approximated by a rectangular region $C(\omega)$ in which points $c_1, c_2, c_3$, and $c_4$ of FIG. 13 are vertices. This approximation is not limited to a rectangular shape and may be polygonal or circular. When $\Delta\theta$ is large or the approximation precision should be raised, it is sufficient if a convex hull having a larger number of vertices is used. When defining this suiting region as $C(\omega)$, the determining inequality system for suiting is:

$$H(e^{j\omega})\in C(\omega) \quad (62)$$

Namely, it is sufficient if $H(e^{j\omega})$ exists in $C(\omega)$.

Figure 14:
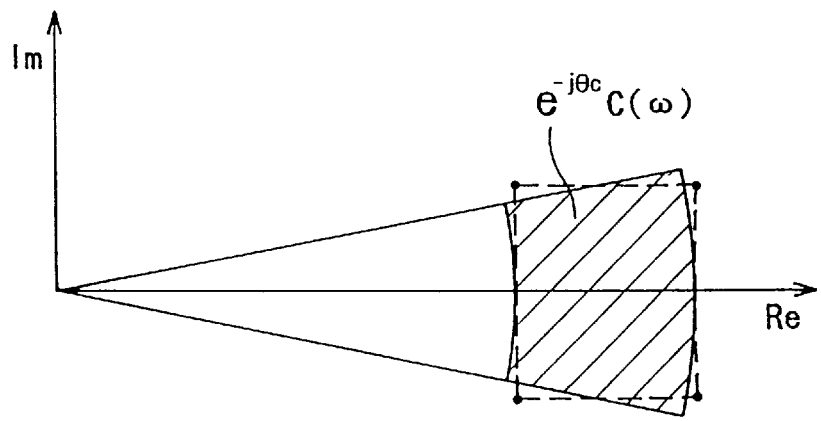
FIG. 14 is a view in which a suiting region $C(\omega)$ of FIG. 13 is shifted onto a real axis.

For convenience of calculation, when the suiting region $C(\omega)$ is now rotated exactly by $-\theta_C$ as shown in FIG. 14 and shifted onto the real axis and the determining inequality system of $H(e^{j\omega})$ is expressed over the real number field while dividing the same into a real part and imaginary part, the following stand:

$$b(M_c(\omega)-\Delta M(\omega)) < R_H(\omega)\cos\theta_c(\omega)+ \quad (63)$$
$$I_H(\omega)\sin\theta_c(\omega) < b(M_c(\omega)+\Delta M(\omega))$$

$$-b(M_c(\omega)\sin\Delta\theta(\omega)) < -R_H(\omega)\sin\theta_c(\omega)+ \quad (64)$$
$$I_H(\omega)\cos\theta_c(\omega) < b(M_c(\omega)\sin\Delta\theta(\omega))$$

b is the parameter for rectifying the form of the expressions and is set as "1" after finding the suiting function. Further, when the following are set:

$$X=(a_0,a_1,\ldots,a_n,b) \quad (65)$$

$$\xi_C(\omega)=(1,\cos\omega,\ldots,\cos(n-1)\omega,\cos n\omega,0) \quad (66)$$

$$\xi_S(\omega)=(0,-\sin\omega,\ldots,-\sin(n-1)\omega,-\sin n\omega,0) \quad (67)$$

it can be expressed as follows:

$$I_H(\omega)=(X,\xi_S(\omega)) \quad (68)$$

$$R_H(\omega)=(X,\xi_C(\omega)) \quad (69)$$

Accordingly, the determining inequality systems become:

$$b(M_c(\omega)-\Delta M(\omega)) < (X,\cos\theta_c(\omega)\xi_c(\omega)+ \quad (70)$$
$$\sin\theta_c(\omega)\xi_s(\omega)) < b(M_c(\omega)+\Delta M(\omega))$$

$$-b(M_c(\omega)\sin\Delta\theta(\omega)) < (X,-\sin\theta_c(\omega)\xi_c(\omega)+ \quad (71)$$
$$\cos\theta_c(\omega)\xi_s(\omega) < b(M_c(\omega)\sin\Delta\theta(\omega))$$

When $e_{n+2}=(0,0,\ldots,0,1)$ is set and the following are established:

$$\eta^+(\omega)=(M_C(\omega)+\Delta M(\omega))e_{n+2}-(\cos\theta_C(\omega)\xi_C(\omega)+\sin\theta_C(\omega)\xi_S(\omega)) \quad (72)$$

$$\eta^-(\omega)=-(M_C(\omega)-\Delta M(\omega))e_{n+2}+(\cos\theta_C(\omega)\xi_S(\omega)+\sin\theta_C(\omega)\xi_S(\omega)) \quad (73)$$

$$\Phi^+(\omega)=M_C(\omega)\sin\Delta\theta(\omega)e_{n+2}-(-\sin\theta_C(\omega)\xi_C(\omega)+\cos\theta_C(\omega)\xi_S(\omega)) \quad (74)$$

$$\Phi^-(\omega)=M_C(\omega)\sin\leftarrow\theta(\omega)e_{+2}+(-\sin\theta_C(\omega)\xi_C(\omega)+\cos\theta_C(\omega)\xi_S(\omega)) \quad (75)$$

in the end, the determining inequality systems become:

$$0<(X,\eta^+(\omega)) \quad (76)$$

$$0<(X,\eta^-(\omega)) \quad (77)$$

$$0<(X,\Phi^+(\omega)) \quad (78)$$

$$0<(X,\Phi^-(\omega)) \quad (79)$$

Thereafter, when $D_0$ is divided to form the generating convex hull and the suiting is carried out, the point X of the solution region is the parameter of the definition (55) of the transfer function as it is, and therefore a FIR filter in which both of the amplitude characteristic and phase characteristic are set in the designated range is obtained.

In the above-described example, the suiting region $C(\omega)$ was set as in the inequalities (63) and (64) according to the upper bound function and the lower bound function, but they are not limited to these. It is also possible even if for example as shown by $C'(\omega)$ in FIG. 13, they are directly given as the convex hull from the first (corresponding to claim 4).

Concerning the all pole filter, it is sufficient if inverse numbers of the points of the above-mentioned suiting region $C(\omega)$ are regarded as a new suiting region and $H^{-1}(z)$ is suited similar to the FIR. Concretely, it is sufficient if a convex hull containing the region in which the points $1/c_1$, $1/c_2$, $1/c_3$, and $1/c_4$ are defined as vertices is defined as a new suiting region. Note, in this case, for stabilization of the $H(z)$, it is necessary that the zeros of $H^{-1}(z)$ all exist inside the unit circle, and therefore when $\omega\to 2\pi$, a constraint that $\theta_C(\omega)-\theta_C(0)=0$ must be satisfied (argument principle).

Note that, in the present design method, for ease of explanation, a design of a FIR filter in which the frequency was one dimensional was exemplified, but it is straightforward easy to expand the present design method with respect to a multidimensional FIR filter.

(2) Design of Phase Characteristic

Figure 15:
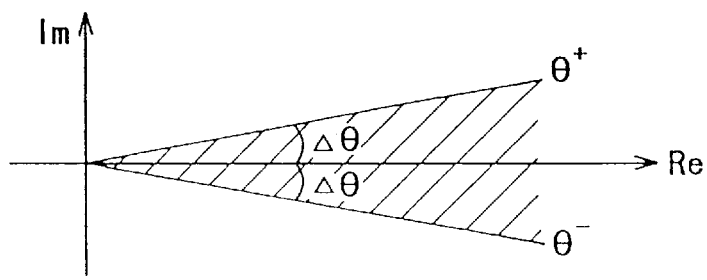
FIG. 15 is a view explaining the design of a digital filter designating only the phase characteristic.

Here, the amplitude characteristic is ignored. There is only the phase, and therefore, in FIG. 13, if $M^-=0$ and $M^+=+\infty$ are set and $C(\omega)$ is taken as a convex cone, the concept is basically the same as that in the case of the former section. When $H(e^{j\omega})$ is rotated by $-\theta_C$ and shifted onto the real axis as in FIG. 15 similar to the former section, the determining inequality system of the phase of $H(e^{j\omega})$ become:

$$-\tan\Delta\theta(\omega) < \qquad (80)$$
$$\text{Im}(\exp(-j\theta_c(\omega))H(e^{jw}))/\text{Re}(\exp(-j\theta_c(\omega))H(e^{jw})) < \tan\Delta\theta(\omega)$$

$$0 < \text{Re}(\exp(-j\theta_c(\omega))H(e^{jw})) \qquad (81)$$

(note, $\Delta\theta<\pi/2$). Here, the following are set:

$$\text{Re}(\exp(-j\theta_c(\omega))H(e^{jw})) = (X, \cos\theta_c(\omega)\xi_c(\omega) + \sin\theta_c(\omega)\xi_s(\omega)) \qquad (82)$$

$$\text{Im}(\exp(-j\theta_c(\omega))H(e^{jw})) = (X, -\sin\theta_c(\omega)\xi_c(\omega) + \cos\theta_c(\omega)\xi_s(\omega)) \qquad (83)$$

(For X, $\xi_C(\omega)$, and $\xi_S(\omega)$, refer to the definitions (65), (66), and (67).) Next, when the following are set:

$$\eta^+((\omega)) = (\cos\theta_C(\omega)\tan\Delta\theta(\omega) + \sin\theta_C(\omega))\xi_C(\omega)) + (\sin\theta_C(\omega)\tan\Delta\theta(\omega) - \cos\theta_C(\omega))\xi_S(\omega) \qquad (84)$$

$$\eta^-(\omega) = (\cos\theta_C(\omega)\tan\Delta\theta(\omega) - \sin\theta_C(\omega))\xi_C(\omega)) + (\sin\theta_C(\omega)\tan\Delta\theta(\omega) + \cos\theta_C(\omega))\xi_S(\omega) \qquad (85)$$

$$\eta^0(\omega) = \cos\theta_C(\omega)\xi_C(\omega) + \sin\theta_C(\omega)\xi_S(\omega) \qquad (86)$$

the determining inequality system can be expressed as:

$$0 < (X, \eta^+(\omega)) \qquad (87)$$

$$0 < (X, \eta^-(\omega)) \qquad (88)$$

$$0 < (X, \eta^0(\omega)) \qquad (89)$$

Below, X can be found by using the suiting process according to the present invention in the same way as in the former section.

The phase characteristic can be similarly suited also for an all pole filter, but the constraint conditions similar to the previous section must be satisfied so as to satisfy the stability of the filter.

(3) Design of Amplitude of Complete Linear Phase FIR Filter

The transfer function of even number degree of the complete linear FIR filter is shown in the following function (also the case of odd number degree can be applied by fine correction).

$$H(z) = a_0 + a_1 z^{-1} + \ldots + a_n z^{-n} + a_{n+1} z^{-(n+1)} + a_n z^{-(n+2)} + \ldots + a_0 z^{-2n} \qquad (90)$$

In this case, according to the definitions (60) and (61), the following can be set:

$$R_H(\omega) = a_0(1 + \cos 2n\omega) + a_1(\cos\omega + \cos(2n-1)\omega) + \ldots + a_{n+1} \cos(n+1)\omega \qquad (91)$$

$$I_H(\omega) = -a_0(0 + \sin 2n\omega) - a_1(\sin\omega + \sin(2n-1)\omega) - \ldots a_{n+1} \sin(n+1)\omega \qquad (92)$$

and therefore if the following are set:

$$X = (a_0, a_1, \ldots, a_{n+1}b) \qquad (93)$$

$$\xi_C(\omega) = (1 + \cos 2n\omega, \cos\omega + \cos(2n-1)\omega, \ldots, \cos(n+1)\omega, 0) \qquad (94)$$

$$\xi_S(\omega) = (-\sin 2n\omega, -\sin\omega - \sin(2n-1), \omega, \ldots, -\sin(n+1)\omega, 0) \qquad (95)$$

they can be expressed as:

$$R_H(\omega) = (X, \xi_C(\omega)) \qquad (96)$$

$$I_H(\omega) = (X, \xi_S(\omega)) \qquad (97)$$

Thereafter, X is found in the same way as that mentioned in "(1) Design of characteristics simultaneously designating amplitude and phase" and the transfer function can be determined (refer to (70) to (79)). Note, in this case, the phase characteristic is completely linear and therefore the upper bound function $\theta^+(\omega)$ and the lower bound function $\theta^-(\omega)$ of the phase are given as the following using a positive number $\Delta(\omega)$ which is not so large:

$$\theta^+(\omega) = -n\omega + \Delta(\omega) \qquad (98)$$

$$\theta^-(\omega) = -n\omega - \Delta(\omega) \qquad (99)$$

Alternatively, it is also possible that the conditions of (78) and (79) are removed by setting $\theta_C = -n\omega$ and the suiting is carried out. Also, the linear phase FIR filter can be obtained by the method described in "(1) Design of characteristics simultaneously designating amplitude and phase" only even by merely setting $\theta^+$ and $\theta^-$ as in the definitions (98) and (99) and setting $\Delta$ as a sufficiently small value. Note that, it is also possible that the amplitude term of the transfer function is preliminarily calculated and the suiting for that term is carried out.

3. Design of All Pass Filter

An explanation was made of the design of the phase characteristic of the FIR filter in "(2) Design of phase characteristic", but the all pass filter can be designed by applying this. When the following is set:

$$P(z) = a_0 + a_1 z^{-1} + a_n z^{-n} \qquad (100)$$

the transfer function H(z) of the all pass filter of degree n is:

$$H(z) = z^{-n} P(z^{-1})/P(z) \qquad (101)$$

and the phase characteristic thereof is:

$$\arg H(e^{jw}) = -n\omega - 2\arg P(e^{jw}) \qquad (102)$$

When defining the upper bound function and lower bound function of the phase characteristic as $\theta^+(\omega)$ and $\theta^-(\omega)$, respectively, the determining inequality system becomes:

$$\theta^-(\omega) < -n\omega - 2\arg P(e^{jw}) < \theta^+(\omega) \qquad (103)$$

and therefore if the following are set:

$$\Phi^+(\omega) = (-n\omega - \theta^-(\omega))/2 \qquad (104)$$

$$\Phi^-(\omega) = (-n\omega - \theta^+(\omega))/2 \qquad (105)$$

It is sufficient if suiting is carried out by defining $\Phi^+(\omega)$ and $\theta^-(\omega)$ as the upper bound function and the lower bound function of arg $P(e^{jw})$ by the procedure of "(2) Design of phase characteristic". Here, as the condition of stabilization of the filter, $\Phi^+(\omega)$ and $\Phi^-(\omega)$ must be determined so that all zeros of P(z) exist in the unit circle, and therefore if $\Phi_C = (\Phi^+ + \Phi^-)/2$ is set, when $\omega \rightarrow 2\pi$, a condition that $\Phi_C(\omega) - \Phi_C(0) = -2\pi n$ must be satisfied. By the existence of this condition, the degree n of the filter determines a rough form of the characteristic. However, if only the difference from the linear phase is defined as the design target of the characteristic, the degree of the filter can be selected almost freely even under this condition.

By combining the all pass filter designed in this way and the IIR filter designed by designating only the amplitude characteristic, an IIR filter which designates both of the amplitude characteristic and the phase characteristic can be constituted. It is sufficient if the phase characteristic of the filter satisfying only the amplitude characteristic is subtracted from the designated phase characteristic and the result is defined as the phase characteristic of the all pass filter.

As described above, by applying the suiting process of the present invention to the design of a digital filter, the following effects are obtained. Namely, the characteristics of the amplitude and phase can be freely and easily designed. Also, the characteristics can be put in the desired range, the minimum degree that can realize this can be strictly calculated, and the number of elements can be made the minimum. The design of the amplitude characteristic can be applied to any filter of the FIR and IIR type and the design can be easily carried out so that it can always satisfy the stabilization condition of the IIR filter. A FIR filter can be directly designed without the mediation of a window function, and therefore deterioration of the characteristic due to this does not occur. Also, the solution region has a certain spread, and therefore it is stable with respect to various types of deviation such as quantization error and, at the same time, the optimization and suiting can be carried out also with respect to the other design conditions by utilizing the spread of the solution region.

Also, the explanation heretofore was made to find a digital signal processing system such as a digital filter which gives a desired characteristic and can achieve this. By turning this concept around, it is possible to give the characteristic of an actual system in place of the above-described desired characteristic and to thereby identify this system. For example, the frequency characteristic of a certain digital signal processing system is measured, the predetermined measurement error is given to this measurement result, and the predetermined characteristic region is set. This setting can be preliminarily automatically carried out if the range of the measurement error is known. Next, by performing suiting in the same way as the above-described example so as to fall in the aforesaid characteristic region, the object system (transfer function etc.) can be identified. Such a method or apparatus can be utilized for the structure analysis of, for example, a digital signal processing system.

Note that, in the above-described example, a procedure of setting the amplitude characteristic of the filter, the lower bound function and upper bound function of the phase characteristic and a procedure of finding the transfer function from the suited amplitude characteristic and phase characteristic are only one example. It is also possible to design the frequency characteristic of the IIR filter in for example the following way. When taking as an example a IIR filter of section 1 of the present example, when the desired frequency characteristic is defined by the target function $g(\omega)$ and allowable error range $M(\omega)$ and the norm of the complex number z is defined by $\|z\|=\max(\text{Im} z, \text{Re} z)$, it is sufficient if $\|P(e^{ej})-g(\omega)Q(e^{j\omega})\|<b_0 M(\omega)$ is defined as the determining inequality system and the parameter vector is defined as the $X(=b_0, b_1, \ldots, b_4, a_0, \ldots, a_4)$ for carrying out the suiting. In this case, so as to make the filter stable, it is necessary to add a condition of phase with respect to Q to the aforesaid determining inequality system by the procedure of the section 2.(2) of the present example etc.

EXAMPLE 6

Next, an example in which the suiting process of the present invention is applied to the design of the frequency domain of a linear analog system (for example, an analog filter, amplifier circuit, a control device of a robot, etc.) The conventional method of design of an analog system had problems of [1] mainly a rectangular frequency characteristic being a prerequisite and the design method being very complex, [2] difficulty to design a characteristic freely, [3] the need for an excessive number of parts for obtaining a necessary characteristic, [4] the lack of a guarantee that the characteristic would fall in the expected range, and [5] the inability to compensate for the deterioration of the characteristic due to various types of deviation and error.

The above-described problems can be all solved if the suiting process of the present invention is used. Below, an explanation will be made in the following degree in the same way as the case of the digital filter.
1. Design of amplitude characteristic of analog system having rational transfer function
2. Design of characteristic of analog system having polynomial transfer function and all pole transfer function
(1) Design of characteristics simultaneously designating amplitude and phase
(2) Design of phase characteristic
3. Phase correction system
1. Design of Amplitude Characteristic of Analog System Having Rational Transfer Function First, for an analog system in which the transfer function is expressed in the form of a rational function, the design is carried out by designating only the amplitude characteristic while ignoring the phase characteristic. The degree of the transfer function can be arbitrarily set, but an explanation will be made below of the rational expression of degree four. The transfer function H(s) is defined as:

$$H(s) = (a_0 + a_1 s + a_2 s^2 + a_3 s^3 + a_4 s^4)/ \qquad (106)$$
$$(b_0 + b_1 s + b_2 s^2 + b_3 s^3 + b_4 s^4)$$
$$= P(s)/Q(s)$$

and the numerator and denominator are set as P(s) and Q(s), respectively as described above. In the case of a polynomial transfer function, it is sufficient if $Q(s)=b_0$ is set.

For convenience of calculation, it is assumed that the amplitude characteristic is indicated by the squared amplitude characteristic. The squared amplitude characteristic of the system is defined as $H(j\omega)H^*(j\omega)$ as in the following equation by substituting $s=j\omega$ in the function H(s) (* expresses a complex conjugate).

$$H(j\omega)H^*(j\omega) = H(j\omega)H(-j\omega) \qquad (107)$$
$$= (A_0 + A_1\omega^2 + A_2\omega^4 + A_3\omega^6 + A_4\omega^8)/$$
$$(B_0 + B_1\omega^2 + B_2\omega^4 + B_3\omega^6 + B_4\omega^8)$$

The squared amplitude characteristic is expressed as the function in $\omega^2$ as in the above equation. These numerator and denominator are set as $p(\omega^2)$ and $q(\omega^2)$, respectively and $f(\omega^2)=p(\omega^2)/q(\omega^2)$ is set. $A_0$, $A_1$, $A_2$, $A_3$ and $A_4$ are expressed as the quadratic polynomials of $a_0$, $a_1$, $a_2$, $a_3$ and $a_4$, and $B_0$, $B_1$, $B_2$, $B_3$ and $B_4$ are expressed as the quadratic polynomials of $b_0$, $b_1$, $b_2$, $b_3$ and $b_4$.

The upper bound function $M^+(\omega^2)$ and the lower bound function $M^-(\omega^2)$ expressing the desired range of the squared amplitude characteristic are given and $x=\omega^2$ is set and the suiting is carried out according to the following inequality system:

$$M^+(x)<f(x)=p(x)/q(x)<M^+(x) \ (0<x<+\infty) \qquad (108)$$
$$0<q(x)(0<x<+\infty) \qquad (109)$$

In the above inequality system, a positive-valued condition of q(x) is necessary for the system to be stabilized. In practical use, it is sufficient if the suiting is carried out on an appropriately wide domain for x, but if the following is carried out, a behavior of the transfer function at infinity can also be controlled. Namely, s'=1/s is set, the point at infinity s'=0 is introduced and function (106) is expressed using s'. Then, $x'=1/\omega^2$ is set and a determining inequality system similar to (108) and (109) are established. For them, on the domain of ($0 \leq x' < 1+\epsilon$), and for the inequality system of (108) and (109), on the domain of ($0 \leq x < 1+\epsilon$), the whole is simultaneously suited. Here, $\epsilon$ is a small positive number. When performing this, an infinite region of half-line can be reduced to a finite region of a half-circle on the Riemann sphere, and thus it becomes sufficient if suiting on a finite region is carried out. From the above equations, the parameters $A_0$, $A_1$, $A_2$, $A_3$, and $A_4$ and $B_0$, $B_1$, $B_2$, $B_3$, and $B_4$ are found according to the already explained procedure of suiting. The transfer function P(s)/Q(s) can be found from the thus obtained squared amplitude characteristic $p(\omega^2)/q(\omega^2)$ in the same way as the already explained case of a digital filter. Also, as the stabilization condition of the system, it is necessary to select Q(s) so that the real part of every pole of H(s) becomes negative.

2. Design of Characteristic of Analog System Having a Polynomial Transfer Function and All Pole Transfer Function Here, an explanation will be made of the design of the characteristics in the case where the transfer function H(s) is a polynomial of s and the case where $H^{-1}(s)$ is a polynomial of s. First, an explanation will be made of a design designating both of the amplitude and phase and next an explanation will be made of the design of only the phase characteristic.

(1) Design of Characteristics Simultaneously Designating Amplitude and Phase

This design is almost the same as the case of a digital filter. The only difference is the frequency characteristic $I_H(\omega)=\text{Im}(H(j\omega))$ and $R_H(\omega)=\text{Re}(H(j\omega))$ of the imaginary part and real part of the transfer function (refer to definitions (60) and (61)), they are slightly changed according to the remainder obtained by dividing n by four, but in any case can be expressed by a slight correction. Therefore, giving an explanation of a case where n is a multiple of four, the transfer function H(s) is:

$$H(s)=a_0+a_1 s+ \ldots +a_1 s^n \tag{110}$$

If the following are set:

$$X=(a_0,a_1,\ldots,a_n,b) \tag{111}$$

$$\xi_C(\omega)=(1,0,-\omega^2,0,\ldots,\omega_n,0) \tag{112}$$

$$\xi_S(\omega)=(0,\omega,0,-\omega^3,\ldots,0,0) \tag{113}$$

they can be expressed as:

$$I_H(\omega)=(x,\xi_S(\omega)) \tag{114}$$

$$R_H(\omega)=(x,\xi_C(\omega)) \tag{115}$$

Below, the transfer function can be found in quite the same way as "2.(1) Design of characteristics simultaneously designating amplitude and phase" of the digital filter in Example 5.

Also the all pole type in which $H^{-1}(s)$ is a polynomial of s can be found in the same way as the above description. Of course, so as to make H(s) stable, the phase characteristic is given so that the real part of every zero of $H^{-1}(s)$ becomes negative. Namely, when $\omega \to +\infty$, $\theta(\omega)-\theta(-\omega)=\pi n$ must stand.

(2) Design of Phase Characteristic

If definitions (111) to (115) and (84) to (89) are used, the design of the phase characteristic of the analog system can be carried out by the method in the same way as "2.(2) Design of phase characteristic" of the digital filter in Example 5.

3. Phase Correction System

The phase correction system is an analog system of correcting only the phase while the amplitude characteristic is held constant regardless of the frequency. This corresponds to an all pass digital filter. When the following is set:

$$P(s)=a_0+a_1 s+a_2 s^2 \ldots +a_n s^n \tag{116}$$

the transfer function H(s) of the phase correction system of degree n is:

$$H(s)=P(-s)/P(s) \tag{117}$$

and the phase characteristic thereof is:

$$\arg H(j\omega) = \arg(P^2(-j\omega)/(P(j\omega)P(-j\omega))) \tag{118}$$

$$= -2 \arg P(j\omega)$$

When defining the upper bound function and lower bound function of the phase characteristic as $\theta^+(\omega)$ and $\theta^-(\omega)$, respectively, the determining inequality system becomes:

$$\theta^-(\omega) < -2\arg P(j\omega) < \theta^+(\omega) \tag{119}$$

and therefore if the following are set:

$$\Phi^+(\omega)=-\theta^-(\omega)/2 \tag{120}$$

$$\Phi^-(\omega)=-\theta^+(\omega)/2 \tag{121}$$

It is sufficient if suiting is carried out by defining $\Phi^+(\omega)$ and $\Phi^-(\omega)$ as the upper bound function and the lower bound function of arg P(j$\omega$) by the procedure of "(2) Design of phase characteristic". Here, as the stabilization condition of the filter, $\Phi^+(\omega)$ and $\Phi^-(\omega)$ must satisfy the constraint concerning the zeros of P(s). In the same way as the digital filter, by combining a system designed by designating only the amplitude characteristic and the phase correction system, an analog system having a rational transfer function designating both the amplitude and phase can be constituted.

When performing design in the above-described way, similar effects to those obtained in the design of a digital filter can be obtained also in the design of an analog system. Further, the above-described method can be used for giving the characteristic of an actual analog system in place of the desired characteristics and identifying this system in the same way as the case of the digital signal processing system.

The procedure explained in the above-described Example 6 can be applied with respect to all of the objects that can be expressed by a linear system. As one example other than the physical system, control of a chemical plant will be mentioned. In chemical plant control, it is sufficient if for example a pressure, temperature in a reaction tank, or a concentration of the produced substance with respect to the quantity of starting material charged per unit time is expressed as a linear system, and this is subjected to Laplace transformation and the transfer function is found. Below, a determination of various coefficients of the system such as heating and pressurizing which can be artificially set according to the above-described Example 6, that is, the design of the plant control system, becomes possible.

EXAMPLE 7

Next, an explanation will be made of an identification apparatus for performing identification of a physical and chemical system by utilizing the suiting process of the present invention. This identification apparatus can be utilized for example for pattern recognition of voice and images, oscillation analysis, data compression by a linear predictor, etc. The identification of a system was also mentioned in the above-described Examples 5 and 6, but in the above-described example, the construction of the system was identified based on the frequency characteristic. Here, an identification method with respect to a discrete series signal, for example, a time series signal such as for example an impulse response is dealt with.

Figure 16:
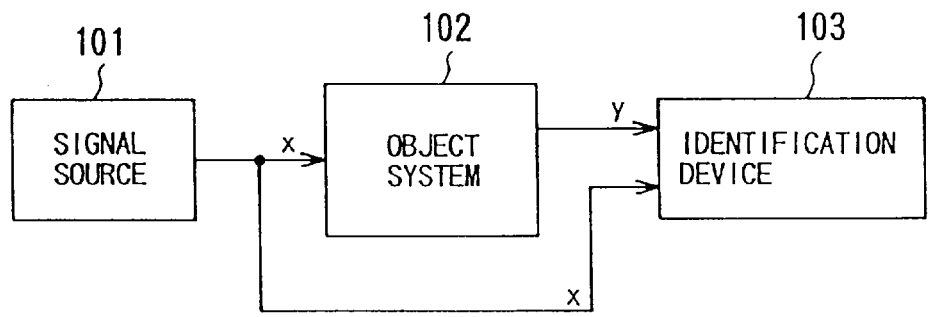
FIG. 16 is a block diagram of a conventional identification apparatus.

In the identification of a system, generally, as shown in FIG. 16, when y is output from the object system 102 by receiving a signal x from the signal source 101, the identification device 103 determines the model of the object system 102 in response to these x and y. x and y are continuous or discrete signals, but in the case of the continuous signal, this is sometimes sampled and made discrete and when the output from the object system 102 which was sampled in a degree of n-th time is defined as $y_n$ and the input to an object system 102 is defined as $x_n$, the system is identified in the form of:

$$y_n = \Sigma a_i f_i(y_{n-2}, \ldots, y_{n-M}, x_n, x_{n-1}, \ldots, x_{n-N}) \tag{122}$$

and the parameters $a_0, a_1, \ldots, a_L$ are determined. The summation symbol expresses the sum of from 0 to L for i. Also, M and N are the degrees of the system, the signal $Y_{n-M}$ expresses a signal traced back by M from the n-th degree and $x_{n-N}$ expresses a signal traced back by N from the n-th degree. There also exists an identification apparatus which identifies a system without the use of the signal x from the signal source 101 and based on only the output y from the object system 102, In this case, the recursion formula (122) becomes an equation not containing $x_i$.

In the conventional identification method, $$V = \Sigma(y_n - \Sigma a_i f_i(y_{n-1}, \ldots, y_{n-M}, x_n, \ldots, x_{n-N}))^2 \tag{123}$$

was set or the like, and the parameter was determined so that V became a minimum. The left summation symbol expresses the sum of from 0 to k for n, and the right expresses from 0 to L for i. However, this procedure has a problem in that it is assumed that the object systems satisfy a statistical nature convenient for handling. In addition, the square sum V of the identification error was made the minimum and a large difference sometimes instantaneously existed between the response of a found model and a real system. Accordingly, the precision of identification was unclear. When the suiting process of the present invention is utilized, the identification error can be systematically evaluated at every instant, and therefore a proper identification apparatus considering the error of identification can be obtained.

An explanation will be made below of an identification apparatus utilizing the suiting process according to the present invention in the following order:
1. Identification of linear discrete system
2. Identification of nonlinear system of certain class
3. Identification of linear analog system
1. Identification of Linear Discrete System The form of the object system is assumed to be:

$$S_y = b_0 y_n + b_1 y_{n-1} + \ldots + b_M y_{n-M} + (a_0, x_n) + (a_1, x_{n-1}) + \ldots + (a_N, x_{n-N}) + c \tag{124}$$

Here, it is assumed that $a_k$ and $x_k$ are L-dimensional vectors, and parenthesized superscripts express the components of the vectors. $b_0$ is the parameter for rectifying the form of expressions and is set as "1" later. $S_y$ indicates the form in which the right side of recursion formula (122) is shifted to the left side in the linear case, ideally becomes "0", and is called the prediction error. The measured response is set as:

$$\eta_n = (1, y_n, y_{n-1}, \ldots, y_{n-M}, x_n^{(1)}, x_n^{(2)}, \ldots, x_n^{(L)}, x_{n-1}^{(1)}, \ldots, x_{n-N}^{(L)}) \tag{125}$$

The response has an error or fluctuation, but when this is defined as $\Delta\eta_n$, the generating convex hull $C_n$ is constituted so that the following always stands:

$$\eta_n + \Delta\eta_n \in C_n$$

and this is expressed as:

$$C_n = \{s_1 \eta_n^{(1)} + s_2 \eta_n^{(2)} + \ldots + s_K \eta_n^{(K)} | \ldots 0 \leq s_i, s_1 + s_2 + \ldots + s_K = 1\} \tag{126}$$

Here, $\eta_n^{(1)}, \eta_n^{(2)}, \ldots, \eta_n^{(K)}$ are the vertices of the generating convex hull $C_n$. Also, the following is set:

$$X = (c, b_0, b_1, \ldots, b_M, a_0^{(1)}, a_0^{(2)}, \ldots, a_0^{(L)}, a_1^{(1)}, \ldots, a_N^{(L)}) \tag{127}$$

When the allowable identification error (allowable error) is expressed by the upper bound function $M^+(n)$ and the lower bound function $M^-(n)$, the determining inequality system is:

$$b_0 M^-(n) < S_y(C_n) < b_0 M^+(n) (n=0, 1, 2, \ldots, n_{max}) \tag{128}$$

Namely, $$b_0 M^-(n) < (X, \eta_n^{(k)}) < b_0 M^+(n) \ (k=1,2,\ldots,K, n=0,1,2,\ldots, n_{max}) \tag{129}$$

Where $y_n$ is the impulse response, as $n_{max}$, it is necessary to select n when $|y_n|$ approaches "0" to a certain extent, but when it becomes small, it is also possible to absorb the same into the generating convex hull $C_n$ as error. Thereafter, the suiting is carried out by the already explained procedure and the solution region S is found. This $C_n$ slightly differs from the generating convex hull in Example 3. However, if $e_0 = (0, 1, 0, 0, \ldots, 0)$ is set and the following are set:

$$C^+_n = -C_n + e_0 M^+(n) \tag{130}$$

$$C^-_n = C_n - e_0 M^-(n) \tag{131}$$

The inequality system (129) becomes:

$$0 < (X, C^+_n) \tag{132}$$

$$0 < (X, C^-_n) \tag{133}$$

and they can be expressed by the generating convex hull and determining inequality system having the same form as those in Example 3. The solution region S becomes the set of the suiting identification parameters as they are. Even if an error or fluctuation exists in the input to the identification system, so far as they are contained in the generating convex hull $C_n$, a strong robust property where the identification error of the system is contained in the allowable error range will be obtained.

When the results obtained by repeating the measurement by a large number of times are defined as $\eta_n^{(1)}, \eta_n^{(2)}, \ldots \eta_n^{(k)}$, the structure of an actually generating convex hull in this case becomes possible by setting a slightly large convex hull containing all of them as $C_n$. The degree of enlargement is determined by considering the cause of producing a deviation such as the nonlinearity of the system, change along with time, load fluctuation, etc. It is also possible to introduce a statistical procedure. When the error is known in advance, it is also possible to automatically constitute the generating convex hull in accordance with that error. Moreover, it is also possible to constitute the generating convex hull with respect to each of the sets of the measurement values of the response with respect to the different signals and perform the suiting with respect to the whole.

Note that, in the above-described example, the input data was expressed in the form of a generating convex hull $C_n$, but it is not always necessary to produce the convex hull. Namely, it is also possible to set $C_n=\{\eta_n\}$ and to perform the identification of the system.

Figure 17:
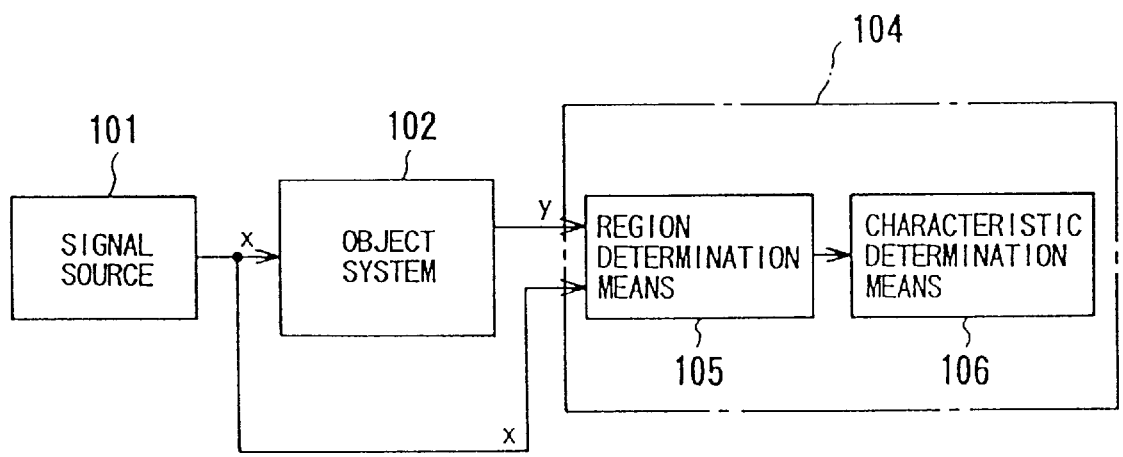
FIG. 17 is a block diagram of the identification apparatus of Example 7 of the present invention.

FIG. 17 is a block diagram of the identification apparatus using the above-described identification method. An identification device 104 is provided with a region determination means 105 which gives a region necessary for the suiting to the signals x and y from the object system 102 and a characteristic determination means 106 which determines the characteristic of the system so that it is within the aforesaid region. The region determination means 105 gives the upper bound and lower bound functions and the generating convex hull (126) to the input signal, and the characteristic determination means 106 calculates the parameter of the system based on the inequality system (129).

2. Identification of Nonlinear System of Certain Class

Assume that the form of the object system can be expressed as:

$$S_y = \Sigma a_i f_i(y_n', x_n') \qquad (134)$$

while preliminarily selecting $f_i$. The summation symbol expresses the sum of from 0 to N for i. Here, it is assumed that $x_n$ is the vector, the parenthesized superscripts express the components of the vectors, and the following are set:

$$y_n' = (y_n, y_{n-1}, \ldots, y_{n-M})$$

$$x_n' = (x_n^{(1)}, x_n^{(2)}, \ldots, x_n^{(L)}, x_{n-1}^{(1)}, \ldots, x_{n-N}^{(L)}) \qquad (135)$$

and $(f_0, \ldots, f_N)$ are a set of linear independent functions. Note that, it is also possible $f_i(y', x')$ are nonlinear concerning the factors x' and y'.

If the following is set:

$$\eta_n = (f_1(y_n', x_n'), f_2(y_n', x_n'), \ldots f_n(y_n', x_n')) \qquad (136)$$

$\eta_n$ is regarded as the measurement data, and the following is set:

$$X=(a_0, a_1, \ldots, a_N) \qquad (137)$$

later the procedure of the former section can be applied as it is.

3. Identification of Linear Analog System

In the case of a continuous system, the error produced at the time of discretization is absorbed into the convex hull $C_n$ and the allowable error. This will be explained by a simple analog system.

$$S_y = by_n + a_0(dx/dt) + a_1(d^2x/dt^2) \qquad (138)$$

is assumed and the determination of $a_0$ and $a_1$ is considered. The differentiation is made discrete and the following are set:

$$dx/dt = (x_n - x_{n-1})/\Delta t + \Delta_1 \qquad (139)$$

$$d^2x/dt^2 = (x_n - 2x_{n-1} + x_{n-2})/\Delta t^2 + \Delta_2 \qquad (140)$$

$\Delta t$ is the sampling interval, and $\Delta_1$ and $\Delta_2$ are discretization errors. Where precision is necessary, a higher discretization is carried out until $\Delta_1$ and $\Delta_2$ become sufficiently small.

When the following are set:

$$x_n' = (x_n - x_{n-1})/\Delta t \qquad (141)$$

$$x_n'' = (x_n - 2x_{n-1} + x_{n-2})/\Delta t^2 \qquad (142)$$

it becomes:

$$S_y = by_n + a_0(x_n' + \Delta_1) + a_1(x_n'' + \Delta_2) \qquad (143)$$

Here, it is assumed only the errors of discretization are produced. In this case, it is sufficient if the maximum value and minimum value that can be given by $\Delta_1$ and $\Delta_2$ are regarded as the error range of the input data $x_n'$ and $x_n''$, and the generating convex hull $C_n$ is constituted. Later, the suiting explained in the former section is carried out. Where the solution region S becomes empty since $\Delta_1$ and $\Delta_2$ are large etc., it is sufficient if the precision of discretization is raised to a certain extent or the degree of the system to be assumed is raised. Also, the above-described procedure can be applied also to a system including a time delay such as integration etc.

Alternatively, it is also possible even if at first the input signal is held to be continuous and the following are set:

$$\eta^-(t) = (-M^-(t)dx(t)/dt, d^2x(t)/dt^2) \qquad (144)$$

$$\eta^+(t) = (M^+(t), -(dx(t)/dt), -(d^2x(t)/dt^2)) \qquad (145)$$

$X=(b, a_0, a_1)$ is defined and the continuous determining inequality system:

$$0 < (X, \eta^-(t)) \qquad (146)$$

$$0 < (X, \eta^+(t)) \qquad (147)$$

are established. Next, suiting for the continuous suiting region is carried out according to the procedure of Example 3.

It is obvious that the thus obtained system $S_y$ does not cause a deterioration of a characteristic due to a discretization. That is, with respect to the continuous inputs x(t) and y(t), the following always stands:

$$bM^-(t) < S_y(x(t), y(t)) < bM^+(t) \qquad (148)$$

Note that, the above-described identification method can be utilized also for the design of the impulse response of the system etc. Namely, in place of the measurement value of the object system in the above-described identification method, if a desired characteristic of the time series is given and the design allowance is given as the allowable error range in place of the identified error, the system design can be made. Here, the design allowance can be given in the form of the range of $S_y$ (the inequality systems (128) and (148)) or the range $C_n$ of $\eta_n$ (convex hull (126)).

In the case of a digital filter, the method of "1. Identification of discrete linear system" of Example 7 can be applied as it is. $S_y$ becomes an FIR filter when M=0 while expresses an IIR filter when M≧1 and therefore is utilized for both filters. The convex hull $C_n$ is constituted by expressing the desired characteristic by $\eta_n$ and considering the quantization error etc. It is also possible to simply define the following:

$$C_n = \{\eta_n\} \qquad (149)$$

In this way, the solution region S found by the suiting becomes the set of values of the coefficients of the filter.

In the case of an analog filter, when the method of "3. Identification of linear analog system" of Example 7 is applied, a system design in a time domain of a linear analog system (for example an analog filter, amplification circuit, a control device for a robot, etc.) can be carried out. It is different from the case of a digital filter in the point that the discretization error is inevitably added to the input of the desired characteristic.

According to the above-explained identification apparatus, a range of the identified error which can be permitted is given and identification is carried out within that range, and therefore the identification error can be evaluated. Accordingly a suiting identification apparatus considering the error of the identification can be obtained and, at the same time, further the following effects are obtained. Namely, [1] a discrete error of the continuous system can be absorbed, [2] robust stable identification can be carried out with respect to the fluctuation of the object system, noise, etc., [3] stable identification can be carried out also for the error by approximating the impulse response of the IIR system by a finite sequence, [4] the existence of the solution region S is decided while varying the degree of the model system in the same way as the flow chart of FIG. 4, whereby the degree of the object system can be estimated, and [5] the optimization can be carried out also with respect to another condition (for example power consumption) by utilizing the spread of the solution region S.

Note that, the present example relates to a system in which the discrete series of the input is expressed by one suffix n, but it is straightforward to expand the present example to a multidimensional system having an input discrete series expressed by a large number of suffixes.

EXAMPLE 8

An explanation will be made next of another example utilizing the suiting process of the present invention. In a system wherein an analog system, A/D converter or a D/A converter, etc. exist in a mixed manner, the amplitude and phase characteristics are affected in various ways by the aforesaid analog system and signal converter (aperture effect, group delay distortion, etc.) A desired characteristic should be realized by correcting them by the digital filter. However, in the procedure by the conventional optimization method etc., an arbitrary characteristic cannot be realized in such a case or even if it is realized, a higher digital filter is necessary. For this reason, generally several expedients have been considered by adding mechanisms for the correction such as making the filter have multi-rates, improving the analog system part and so on. If the suiting process of the present invention is used, the digital filter can be designed by any characteristic and by a small degree, whereby a distorted characteristic can be equalized by the interposition of the analog system etc.

Figure 18:
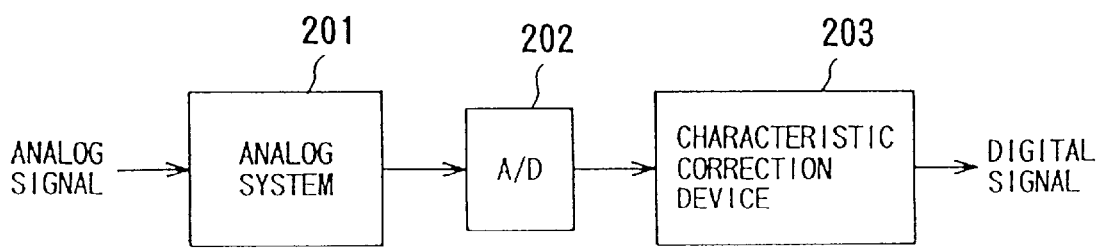
FIG. 18 is a block diagram of a characteristic correction device of Example 8 of the present invention.

FIG. 18 shows an example in which the characteristic correction device of the present invention is connected to an analog system. A signal from an analog system 201 is converted to a digital signal by an A/D converter 202 and sent to the characteristic correction device 203. The characteristic correction device 203 is constituted by a digital filter and a suiting apparatus explained in Examples 5 or 7. The characteristic correction is carried out in the following way:

(1) First, the correction device 203 is set to a state where the signal is simply passed.

(2) A reference signal is sent to the analog system 201 and the characteristics of the analog system 201 and the A/D converter 202 are measured from the outputs with respect to this. At this time, it is also possible even if a correction device 203 is used as the identification device and the measurement of characteristics is carried out.

(3) The amount of the gap between the characteristic before the correction and the desired characteristic is set as the characteristic of the digital filter 203. The design of the characteristic of the filter in the time domain can be carried out by the procedure explained in "1. Identification of discrete linear system" of Example 7.

(4) For the design of the characteristic of the filter in the frequency domain, the structure of the digital filter is determined according to whether the object of correction is one of the amplitude characteristic and the phase characteristic or both of them. If only the amplitude characteristic, any of an IIR or FIR filter can be used. In the case of only the phase characteristic, the all pass filter or FIR filter is used. Also, when both of the amplitude and phase are corrected, there are the options of [1] an IIR and all pass filter, [2] an FIR and all pass filter, and [3] only an FIR filter.

In the above-described example, the characteristic correction device 203 was connected at a stage after the analog system 201, but it is also possible that the characteristic correction device is disposed at a stage in front of the analog system and correction is carried out. Namely, the arrangement becomes the digital input→characteristic correction device→D/A converter→analog system→analog output. Also, where the digital system and the analog system exist in a mixed manner, it is also possible that the correction device is connected to the middle of the entire system. The arrangement becomes for example the analog input→analog system 1→A/D converter→characteristic correction device→D/A converter→analog system 2→analog output. That is, the transfer function of an entire system is expressed by the product of the transfer functions of the respective constituent elements, and therefore there is no problem even if the correction device is disposed at any of the front, back, and middle of the system.

When the characteristic correction as described above is carried out, the degree of freedom of design of the analog system is greatly increased. Also, in certain cases, it becomes possible to make the structure of the analog system considerably simpler. Further, it is also possible to automatically perform the above-described correction by utilizing a microprocessor etc.

EXAMPLE 9

Next, an explanation will be made of an example in which the suiting is carried out in a state where the suiting region is deliberately reduced in the parameter space. This is effective where that circuit is designed so that the desired specification is always satisfied even if a change occurs along with time or temperature in the parts in for example an electronic circuit. Moreover, this example is effective also with respect to error such as canceling in a digital system.

Assume that the original problem of the suiting process is expressed as:

$$0<(X,\eta_i)(i=1,2,\ldots,m)\, X=(a_1,a_2,\ldots,a_n,b)\, \eta_i=(\eta_{i1},\eta_{i2},\ldots,\eta_{in},\eta_{in+1}) \qquad (150)$$

$\eta_i$ is a vector expressing the upper bound function, lower bound function, etc., and the suiting region is expressed by $\eta_i$ in the parameter space. b is the parameter for rectifying the form of the expression and later is set to "1".

Assume that the change $\delta$ ($\in R^{n+1}$) of X is always contained in the convex hull $\Delta$. Namely, it is defined as:

$$X+\delta \in X+b\Delta \quad (151)$$

Here, $\Delta$ can be expressed as:

$$\Delta=\{s_1\Delta_1+s_2\Delta_2+\ldots+s_L\Delta_L|s_1+\ldots+S_L=1, \Delta_j \in R^{n+1}\}$$ and therefore if the following stands:

$$0<(X+b\Delta_j, \eta_i) \ (j=1,2,\ldots,L, i=1,2,\ldots,m) \quad (152)$$

the inequality system (150) stands also for an arbitrary $X+\delta$ satisfying the inequality system (151). The right side of (152) can be transformed to:

$$(X,\eta_i)+b(\Delta_j,\eta_i) \quad (153)$$

and accordingly if the following is set:

$$\eta_j'=(\eta_{i1},\eta_{i2},\ldots,\eta_{in}, \eta_{in+1}+\min(\Delta_j,\eta_i))(i=1,2,\ldots,m)(1\leq j \leq L)$$

The inequality system (152) becomes equivalent to:

$$0<(X,\eta_i')(i=1,2,\ldots m) \quad (154)$$

This is not the only expression but a variety of expressions is possible.

In this way, if the inequality system (154) is considered as the problem of the suiting process, all of the element Xs of the solution region of the inequality system (154) satisfy:

$$0<(X_s+\delta,\eta_i)(i=1,2,\ldots,m)$$

in the original problem, and it is seen that it is robust and stable. Where the original problem is aimed at a polynomial suiting function, the correction from $\eta_i$ to $\eta_i'$ corresponds to reduction of the upper bound function by an amount of about $\min(\Delta_j, \eta_i)$ (note, $1 \leq j \leq L$) and increase of the lower bound function by the same amount, that is, the direct reduction of the suiting region of the original problem. Also in the general case, the convex hull expressing the suiting region becomes smaller by this correction.

Note that, the characteristics treated in the suiting apparatus and suiting process of the present invention are not restricted to the physical characteristics, and also a data processing technique such as data compression or a chemical characteristic etc. can be adopted.

While the invention has been described by reference to specific embodiments chosen for purposes of illustration, it should be apparent that numerous modifications could be made thereto by those skilled in the art without departing from the basic concept and scope of the invention.

I claim:

1. A suiting apparatus for designing a system, said suiting apparatus having a processor, a memory, an input device and an output device to execute a suiting process, said suiting apparatus comprising:
   means for inputting data that corresponds to an allowable range of physical characteristics to set a suiting range;
   suiting function determination means for determining a suiting function, based upon the inputted data, at least approximately contained in said allowable range by solving simultaneous inequalities, said suiting function determination means setting said suiting function as a family of functions having certain parameters, values of said certain parameters being determined by solving said simultaneous inequalities, said suiting function determination means determining an allowable range of values of said certain parameters; and
   means for designing a system in accordance with said determined suiting function.

2. A suiting apparatus according to claim 1, wherein said suiting region setting means defines the suiting region by an upper bound function restricting the upper bound of the suiting region and a lower bound function restricting the lower bound of the suiting region.

3. A suiting apparatus according to claim 1, wherein said suiting region setting means defines the suiting region by at least one convex hull.

4. A suiting apparatus according to claim 1, wherein said suiting region setting means defines the suiting region by a target function and an allowable error range.

5. A suiting apparatus according to claim 1, wherein said suiting region setting means defines the suiting region by intervals on a sequence of points.

6. A suiting apparatus according to claim 2, wherein said suiting function indicates a function of a data interpolation.

7. A suiting apparatus according to claim 1, wherein said suiting function indicates an amplitude characteristic of a digital signal processing system.

8. A suiting apparatus according to claim 1, wherein said suiting function indicates a phase characteristic of a digital signal processing system.

9. A suiting apparatus according to claim 1, wherein said suiting function indicates an amplitude characteristic of an analog system.

10. A suiting apparatus according to claim 1, wherein said suiting function indicates a phase characteristic of an analog system.

11. A characteristic correction apparatus of the suiting apparatus of claim 1, comprising means for measuring a characteristic of a system having an analog system and at least one of an A/D converter and a D/A converter.

12. A characteristic correction apparatus of the suiting apparatus of claim 1, comprising a digital filter connected to a system having an analog system and at least one of an A/D converter and a D/A converter to correct said characteristic of said system.

13. A suiting apparatus comprising:
   means for setting a suiting region corresponding to an allowable range of a physical characteristic;
   a suiting function determination means for finding the suiting function at least approximately contained in this range of suiting region by solving simultaneous inequalities;
   a suiting region display means for visually displaying said suiting region; and,
   a suiting function display means for displaying said suiting function while superimposing the same on the suiting region displayed by this suiting region display means,
   said suiting function determination means setting said suiting function as a family of functions having parameters and, at the same time, finding the values of the parameters by solving the simultaneous inequalities.

14. The suiting apparatus according to claim 13, further comprising:
   means for inputting a changed suiting region in accordance with said suiting function obtained by said suiting function determining means, so that a changed suiting function is obtained by said suiting function determining means.

15. A suiting process for designing a system, comprising the steps of:
   inputting data corresponding to an allowable range of a physical characteristic so that a suiting range is set in a storage device;

using a processor to determine a suiting function, based upon the inputted data, at least approximately contained in an allowable range of the suiting region by solving simultaneous inequalities, the processor setting the suiting function as a family of functions having certain parameters, values of the certain parameters being determined by solving the simultaneous inequalities, and determining an allowable range of values of the certain parameters; and designing a system in accordance with the determined suiting function.

16. The suiting process of claim 15, further comprising storing instructions executed by the processor for determining the suiting function in a storage medium.

17. A suiting apparatus for designing a system, said suiting apparatus having a processor, a memory, an input device and an output device to execute a suiting process, said suiting apparatus comprising:

means for inputting data that corresponds to an allowable range of physical characteristics to set a suiting region;

suiting function determination means for determining a suiting function, based upon the inputted data, at least approximately contained in said allowable range by solving simultaneous inequalities, said suiting function determination means setting said suiting function as a family of functions having certain parameters, values of the certain parameters being determined by solving said simultaneous inequalities;

means for correcting said suiting function when said suiting function projects over said suiting region in order to remove a projection; and means for designing a system in accordance with said determined suiting function.

18. A suiting apparatus for designing a system, said suiting apparatus having a processor, a memory, an input device and an output device to execute a suiting process, said suiting apparatus comprising:

means for inputting data that corresponds to an allowable range of physical characteristics to set a suiting region;

suiting function determination means for determining a suiting function, based upon the inputted data, at least approximately contained in said allowable range by solving simultaneous inequalities, said suiting function determination means setting said suiting function as a family of functions having certain parameters values of the certain parameters being determined by solving said simultaneous inequalities, said setting means defining said suiting region according to an inequality system of piece-wise continuous functions, said setting means including means for dividing said suiting region into small parts and constructing produced generating convex hulls in said small parts; and means for designing a system in accordance with said determined suiting function.

19. A suiting apparatus for designing a system, said suiting apparatus having a processor, a memory, an input device and an output device to execute a suiting process, said suiting apparatus comprising:

means for inputting data that corresponds to an allowable range of physical characteristics to set a suiting region;

suiting function determination means for determining a suiting function, based upon the inputted data, at least approximately contained in said allowable range by solving simultaneous inequalities, said suiting function determination means setting said suiting function as a family of functions having certain parameters, values of the certain parameters being determined by solving said simultaneous inequalities, said suiting function determination means comprising:

means for initially setting said family of functions of said suiting functions;

means for determining whether a suiting function exists that conforms to said suiting region; and means for finding a solution of said suiting function when said determining means determines that said suiting function exists;

means for automatically changing a setting of said family of functions of said suiting functions to a broader family when said determining means determines that said suiting function does not exist; and means for designing a system in accordance with said determined suiting function.

20. A suiting apparatus for designing a system, said suiting apparatus having a processor, a memory, an input device and an output device to execute a suiting process, said suiting apparatus comprising:

means for inputting data that corresponds to an allowable range of physical characteristics to set a suiting region;

suiting function determination means for determining a suiting function, based upon the inputted data, at least approximately contained in said allowable range by solving simultaneous inequalities, said suiting function determination means setting said suiting function as a family of functions having certain parameters, values of the certain parameters being determined by solving said simultaneous inequalities;

suiting region reduction means for converting a predetermined quantity of change of said values of said certain parameters of said suiting function to a quantity of change of said suiting region in a parameter space and reducing said suiting region in said parameter space by a quantity corresponding to said quantity of change of said suiting region; and means for designing a system in accordance with said determined suiting function.

21. A suiting apparatus for designing a system, comprising:

a recording medium that stores a suiting program; and a processor that executes said suiting program stored in said recording medium to determine a suiting function, based upon inputted data corresponding to an allowable range of a physical characteristic used to set a suiting region, at least approximately contained in an allowable range of the suiting region by solving simultaneous inequalities, said processor setting said suiting function as a family of functions having certain parameters, values of said certain parameters being determined by solving said simultaneous inequalities, and determining an allowable range of values of said certain parameters, so that a system is designed in accordance with said determined suiting function.

* * * * *

UNITED STATES PATENT AND TRADEMARK OFFICE
CERTIFICATE OF CORRECTION

PATENT NO. : 6,032,106
DATED : February 29, 2000
INVENTOR(S) : M. ISHII

It is certified that error appears in the above-identified patent and that said Letters Patent is hereby corrected as shown below:

At column 32, line 17 (claim 6, line 1) of the printed patent, "2" should be ---1---.

At column 33, line 46 (claim 18, line 12) of the printed patent, after "parameters" insert --- , ---.

Signed and Sealed this

Seventeenth Day of April, 2001

*Attest:*

NICHOLAS P. GODICI

*Attesting Officer*     *Acting Director of the United States Patent and Trademark Office*